(12) United States Patent
Gilbert

(10) Patent No.: US 8,428,813 B2
(45) Date of Patent: Apr. 23, 2013

(54) DYNAMIC DECISION SEQUENCING METHOD AND APPARATUS FOR OPTIMIZING A DIAGNOSTIC TEST PLAN

(75) Inventor: Harry M. Gilbert, Portage, MI (US)

(73) Assignee: Service Solutions US LLC, Charlotte, NC (US)

( * ) Notice: Subject to any disclaimer, the term of this patent is extended or adjusted under 35 U.S.C. 154(b) by 588 days.

(21) Appl. No.: 12/543,641

(22) Filed: Aug. 19, 2009

(65) Prior Publication Data

US 2010/0010702 A1    Jan. 14, 2010

Related U.S. Application Data

(63) Continuation-in-part of application No. 11/452,250, filed on Jun. 14, 2006.

(51) Int. Cl.
*G06F 7/00* (2006.01)

(52) U.S. Cl.
USPC .......................................... 701/31.4; 701/32.1

(58) Field of Classification Search .................. 701/29.1, 701/29.2, 29.4, 34.4, 31.4, 32.1; 702/182–185
See application file for complete search history.

(56) References Cited

U.S. PATENT DOCUMENTS

| | | |
|---|---|---|
| 4,404,639 A | 9/1983 | McGuire et al. |
| 4,757,463 A | 7/1988 | Ballou et al. |
| 4,796,206 A | 1/1989 | Boscove et al. |
| 4,817,092 A | 3/1989 | Denny |
| 4,866,635 A | 9/1989 | Kahn et al. |
| 4,873,687 A | 10/1989 | Breu |
| 4,881,230 A | 11/1989 | Clark et al. |
| 4,943,919 A | 7/1990 | Aslin et al. |
| 4,954,964 A | 9/1990 | Singh |
| 4,964,125 A | 10/1990 | Kim |
| 4,985,857 A | 1/1991 | Bajpai et al. |
| 5,010,487 A | 4/1991 | Stonehocker |
| 5,023,791 A | 6/1991 | Herzberg et al. |
| 5,025,392 A | 6/1991 | Singh |
| 5,036,479 A | 7/1991 | Prednis et al. |
| 5,099,436 A | 3/1992 | McCown et al. |

(Continued)

FOREIGN PATENT DOCUMENTS

| | | |
|---|---|---|
| CN | 1527934 A | 9/2004 |
| DE | 10233503 A1 | 2/2004 |

(Continued)

OTHER PUBLICATIONS

European Search Report for Appl. No. 07252442.4, dated Sep. 11, 2007.

(Continued)

*Primary Examiner* — Yonel Beaulieu
(74) *Attorney, Agent, or Firm* — Baker & Hostetler LLP

(57) ABSTRACT

A diagnostic tool and a computer-implemented method for generating testing and diagnosis procedures for vehicle diagnosis include determining if a first procedure remains to be performed, if a first procedure remains to be performed, then determining whether: there is a second procedure dependent on the first procedure, or the first procedure can run in parallel to the second procedure, if there is a second procedure dependent on the first procedure, then performing the first procedure, if the first procedure can run in parallel to the second procedure, then performing the first procedure, and determining if the second procedure remains to be performed.

21 Claims, 11 Drawing Sheets

U.S. PATENT DOCUMENTS

| | | | |
|---|---|---|---|
| 5,109,380 A | 4/1992 | Ogino | |
| 5,111,402 A | 5/1992 | Brooks et al. | |
| 5,127,005 A | 6/1992 | Oda et al. | |
| 5,161,158 A | 11/1992 | Chakravarty et al. | |
| 5,184,312 A | 2/1993 | Ellis | |
| 5,214,577 A | 5/1993 | Sztipanovits et al. | |
| 5,270,920 A | 12/1993 | Pearse et al. | |
| 5,293,323 A | 3/1994 | Doskocil et al. | |
| 5,396,422 A | 3/1995 | Forchert et al. | |
| 5,442,549 A | 8/1995 | Larson | |
| 5,491,631 A | 2/1996 | Shirane et al. | |
| 5,524,078 A | 6/1996 | Kolb et al. | |
| 5,541,840 A | 7/1996 | Gurne et al. | |
| 5,561,762 A | 10/1996 | Smith et al. | |
| 5,572,424 A | 11/1996 | Kellogg et al. | |
| 5,586,252 A | 12/1996 | Barnard et al. | |
| 5,617,039 A | 4/1997 | Kuck et al. | |
| 5,631,831 A | 5/1997 | Bird et al. | |
| 5,670,939 A | 9/1997 | Rodewald et al. | |
| 5,671,141 A | 9/1997 | Smith et al. | |
| 5,696,676 A | 12/1997 | Takaba | |
| 5,729,452 A | 3/1998 | Smith et al. | |
| 5,742,500 A | 4/1998 | Irvin | |
| 5,778,381 A | 7/1998 | Sandifer | |
| 5,835,871 A | 11/1998 | Smith et al. | |
| 5,838,261 A | 11/1998 | Lauta et al. | |
| 5,852,789 A | 12/1998 | Trsar et al. | |
| 5,883,586 A | 3/1999 | Tran et al. | |
| 5,916,286 A | 6/1999 | Seashore et al. | |
| 5,964,811 A | 10/1999 | Ishii et al. | |
| 5,964,813 A | 10/1999 | Ishii et al. | |
| 5,987,443 A | 11/1999 | Nichols et al. | |
| 6,003,021 A | 12/1999 | Zadik et al. | |
| 6,003,808 A | 12/1999 | Nguyen et al. | |
| 6,006,146 A | 12/1999 | Usui et al. | |
| 6,012,152 A | 1/2000 | Douik et al. | |
| 6,032,088 A | 2/2000 | Feldmann et al. | |
| 6,041,287 A | 3/2000 | Dister et al. | |
| 6,055,468 A | 4/2000 | Kaman et al. | |
| 6,064,998 A | 5/2000 | Zabloudil et al. | |
| 6,067,537 A | 5/2000 | O'Connor et al. | |
| 6,067,538 A | 5/2000 | Zorba et al. | |
| 6,073,127 A | 6/2000 | Lannert et al. | |
| 6,085,184 A | 7/2000 | Bertrand et al. | |
| 6,119,074 A | 9/2000 | Sarangapani | |
| 6,122,575 A | 9/2000 | Schmidt et al. | |
| 6,134,488 A | 10/2000 | Sasaki et al. | |
| 6,141,608 A | 10/2000 | Rother | |
| 6,167,352 A | 12/2000 | Kanevsky et al. | |
| 6,175,787 B1 | 1/2001 | Breed | |
| 6,192,302 B1 | 2/2001 | Giles et al. | |
| 6,205,465 B1 | 3/2001 | Schoening et al. | |
| 6,226,627 B1 | 5/2001 | Polak | |
| 6,236,917 B1 | 5/2001 | Liebl et al. | |
| 6,249,755 B1 | 6/2001 | Yemini et al. | |
| 6,263,268 B1 | 7/2001 | Nathanson | |
| 6,263,322 B1 | 7/2001 | Kirkevold et al. | |
| 6,282,469 B1 | 8/2001 | Rogers et al. | |
| 6,301,531 B1 | 10/2001 | Pierro et al. | |
| 6,314,375 B1 | 11/2001 | Sasaki et al. | |
| 6,330,499 B1 | 12/2001 | Chou et al. | |
| 6,338,148 B1 | 1/2002 | Gillenwater et al. | |
| 6,363,304 B1 | 3/2002 | Ramsey | |
| 6,370,455 B1 | 4/2002 | Larson et al. | |
| 6,434,455 B1 | 8/2002 | Snow et al. | |
| 6,477,453 B2 | 11/2002 | Oi et al. | |
| 6,493,615 B1 | 12/2002 | Johnston | |
| 6,505,106 B1 | 1/2003 | Lawrence et al. | |
| 6,512,968 B1 | 1/2003 | de Bellefeuille et al. | |
| 6,522,987 B1 | 2/2003 | Flink et al. | |
| 6,526,340 B1 | 2/2003 | Reul et al. | |
| 6,526,361 B1 | 2/2003 | Jones et al. | |
| 6,538,472 B1 | 3/2003 | McGee | |
| 6,557,115 B2 | 4/2003 | Gillenwater et al. | |
| 6,560,516 B1 | 5/2003 | Baird et al. | |
| 6,574,537 B2 | 6/2003 | Kipersztok et al. | |
| 6,591,182 B1 | 7/2003 | Cece et al. | |
| 6,609,051 B2 | 8/2003 | Fiechter et al. | |
| 6,611,740 B2 | 8/2003 | Lowrey et al. | |
| 6,615,120 B1 | 9/2003 | Rother | |
| 6,636,790 B1 | 10/2003 | Lightner et al. | |
| 6,640,166 B2 | 10/2003 | Liebl et al. | |
| 6,643,607 B1 | 11/2003 | Chamberlain et al. | |
| 6,652,169 B2 | 11/2003 | Parry | |
| 6,662,087 B1 | 12/2003 | Liebl et al. | |
| 6,694,235 B2 | 2/2004 | Akiyama | |
| 6,708,092 B1 | 3/2004 | Starks et al. | |
| 6,711,134 B1 | 3/2004 | Wichelman et al. | |
| 6,714,846 B2 | 3/2004 | Trsar et al. | |
| 6,738,697 B2 | 5/2004 | Breed | |
| 6,748,304 B2 | 6/2004 | Felke et al. | |
| 6,751,536 B1 | 6/2004 | Kipersztok et al. | |
| 6,768,935 B1 | 7/2004 | Morgan et al. | |
| 6,795,778 B2 | 9/2004 | Dodge et al. | |
| 6,807,469 B2 | 10/2004 | Funkhouser et al. | |
| 6,819,988 B2 | 11/2004 | Dietz et al. | |
| 6,836,708 B2 | 12/2004 | Tripathi | |
| 6,845,307 B2 | 1/2005 | Rother | |
| 6,845,468 B2 | 1/2005 | James | |
| 6,868,319 B2 | 3/2005 | Kipersztok et al. | |
| 6,874,680 B1 | 4/2005 | Klaus et al. | |
| 6,928,349 B1 | 8/2005 | Namaky et al. | |
| 6,941,203 B2 | 9/2005 | Chen | |
| 6,950,829 B2 | 9/2005 | Schlabach et al. | |
| 6,993,421 B2 | 1/2006 | Pillar et al. | |
| 7,010,460 B2 | 3/2006 | Trsar et al. | |
| 7,013,411 B2 | 3/2006 | Kallela et al. | |
| 7,050,894 B2 | 5/2006 | Halm et al. | |
| 7,062,622 B2 | 6/2006 | Peinado | |
| 7,073,120 B2 | 7/2006 | Torii et al. | |
| 7,082,359 B2 | 7/2006 | Breed | |
| 7,103,610 B2 | 9/2006 | Johnson et al. | |
| 7,103,679 B2 | 9/2006 | Bonn | |
| 7,120,559 B1 * | 10/2006 | Williams et al. | 702/185 |
| 7,120,890 B2 | 10/2006 | Urata et al. | |
| 7,124,058 B2 | 10/2006 | Namaky et al. | |
| 7,142,960 B2 | 11/2006 | Grier et al. | |
| 7,162,741 B2 | 1/2007 | Eskin et al. | |
| 7,165,216 B2 | 1/2007 | Chidlovskii et al. | |
| 7,171,372 B2 | 1/2007 | Daniel et al. | |
| 7,203,881 B1 * | 4/2007 | Williams et al. | 714/741 |
| 7,209,815 B2 | 4/2007 | Grier et al. | |
| 7,209,817 B2 | 4/2007 | Abdel-Malek et al. | |
| 7,209,860 B2 | 4/2007 | Trsar et al. | |
| 7,216,052 B2 | 5/2007 | Fountain et al. | |
| 7,251,535 B2 | 7/2007 | Farchmin et al. | |
| 7,272,475 B2 | 9/2007 | Gawlik et al. | |
| 7,272,756 B2 | 9/2007 | Brink et al. | |
| 7,286,047 B2 | 10/2007 | Oesterling et al. | |
| 7,373,225 B1 | 5/2008 | Grier et al. | |
| 7,376,497 B2 | 5/2008 | Chen | |
| 7,379,846 B1 * | 5/2008 | Williams et al. | 702/185 |
| 7,400,954 B2 | 7/2008 | Sumcad et al. | |
| 7,409,317 B2 | 8/2008 | Cousin et al. | |
| 7,428,663 B2 | 9/2008 | Morton et al. | |
| 7,430,535 B2 | 9/2008 | Dougherty et al. | |
| 7,444,216 B2 | 10/2008 | Rogers et al. | |
| 7,483,774 B2 | 1/2009 | Grichnik et al. | |
| 7,555,376 B2 | 6/2009 | Beronja | |
| 7,565,333 B2 | 7/2009 | Grichnik et al. | |
| 7,610,127 B2 | 10/2009 | D'Silva et al. | |
| 7,643,912 B2 | 1/2010 | Heffington | |
| 7,647,349 B2 | 1/2010 | Hubert et al. | |
| 7,715,961 B1 | 5/2010 | Kargupta | |
| 7,739,007 B2 | 6/2010 | Logsdon | |
| 7,751,955 B2 | 7/2010 | Chinnadurai et al. | |
| 7,752,224 B2 | 7/2010 | Davis et al. | |
| 7,761,591 B2 | 7/2010 | Graham | |
| 7,778,746 B2 | 8/2010 | McLeod et al. | |
| 7,788,096 B2 | 8/2010 | Chelba et al. | |
| 7,809,482 B2 | 10/2010 | Bertosa et al. | |
| 7,853,435 B2 | 12/2010 | Dodge et al. | |
| 7,860,620 B2 | 12/2010 | Kojitani et al. | |
| 7,882,394 B2 | 2/2011 | Hosek et al. | |
| 7,925,397 B2 | 4/2011 | Underdal et al. | |
| 8,019,501 B2 | 9/2011 | Breed | |
| 8,024,083 B2 | 9/2011 | Chenn | |

| | | | |
|---|---|---|---|
| 8,055,907 | B2 | 11/2011 | Deem et al. |
| 8,239,094 | B2 | 8/2012 | Underdal et al. |
| 2002/0007237 | A1 | 1/2002 | Phung et al. |
| 2002/0059075 | A1 | 5/2002 | Schick et al. |
| 2002/0091736 | A1 | 7/2002 | Wall |
| 2002/0112072 | A1 | 8/2002 | Jain |
| 2002/0116669 | A1 | 8/2002 | Jain |
| 2002/0173885 | A1 | 11/2002 | Lowrey et al. |
| 2003/0177414 | A1 | 9/2003 | Pillutla et al. |
| 2004/0001106 | A1 | 1/2004 | Deutscher et al. |
| 2004/0039493 | A1 | 2/2004 | Kaufman |
| 2004/0181688 | A1 | 9/2004 | Wittkotter |
| 2005/0043868 | A1 | 2/2005 | Mitcham |
| 2005/0065678 | A1 | 3/2005 | Smith et al. |
| 2005/0071143 | A1 | 3/2005 | Tran et al. |
| 2005/0137762 | A1 | 6/2005 | Rother |
| 2005/0144183 | A1 | 6/2005 | McQuown et al. |
| 2005/0177352 | A1 | 8/2005 | Gravel |
| 2005/0222718 | A1 | 10/2005 | Lazarz et al. |
| 2006/0030981 | A1 | 2/2006 | Robb et al. |
| 2006/0074824 | A1 | 4/2006 | Li |
| 2006/0095230 | A1 | 5/2006 | Grier et al. |
| 2006/0129906 | A1 | 6/2006 | Wall |
| 2006/0136104 | A1 | 6/2006 | Brozovich et al. |
| 2006/0142907 | A1 | 6/2006 | Cancilla et al. |
| 2006/0142910 | A1 | 6/2006 | Grier et al. |
| 2006/0149434 | A1 | 7/2006 | Bertosa et al. |
| 2006/0210141 | A1 | 9/2006 | Kojitani et al. |
| 2006/0229777 | A1 | 10/2006 | Hudson et al. |
| 2007/0100520 | A1 | 5/2007 | Shah et al. |
| 2007/0124282 | A1 | 5/2007 | Wittkotter |
| 2007/0226540 | A1 | 9/2007 | Konieczny |
| 2007/0250228 | A1 | 10/2007 | Reddy et al. |
| 2007/0293998 | A1 | 12/2007 | Underdal et al. |
| 2007/0293999 | A1 | 12/2007 | Underdal et al. |
| 2007/0294000 | A1 | 12/2007 | Underdal et al. |
| 2007/0294001 | A1 | 12/2007 | Underdal et al. |
| 2007/0294002 | A1 | 12/2007 | Underdal et al. |
| 2007/0294003 | A1 | 12/2007 | Underdal et al. |
| 2009/0216584 | A1 | 8/2009 | Fountain et al. |
| 2009/0271066 | A1 | 10/2009 | Underdal et al. |
| 2010/0082197 | A1 | 4/2010 | Kolbet et al. |
| 2010/0262431 | A1 | 10/2010 | Gilbert |

FOREIGN PATENT DOCUMENTS

| | | | |
|---|---|---|---|
| DE | 10332203 | A1 | 2/2005 |
| EP | 1674958 | B1 | 2/2008 |
| GB | 2329943 | A | 4/1999 |
| JP | H03-087671 | A | 4/1991 |
| JP | 06-265596 | | 9/1994 |
| JP | H08-043265 | A | 2/1996 |
| JP | H10-253504 | A | 9/1998 |
| JP | 2001-202125 | A | 7/2001 |
| JP | 2001-229299 | A | 8/2001 |
| JP | 2002-183334 | A | 6/2002 |
| JP | 2004-299587 | A | 10/2004 |
| JP | 2007-326425 | A | 12/2007 |

OTHER PUBLICATIONS

European Search Report for Appl. No. 07252441, dated Jun. 20, 2008.
L.J. Aartman, et al., "An Independent Verification Tool for Multi-Vendor Mode S Airborne Transponder Conformance Testing," 21$^{st}$ Digital Avionics Systems Conference, 2002, pp. 12.E.5-1—12.E.5-11, vol. 2.
"Annex A Test Bit Sequence," Methodology for Jitter and Signal Quality; Specification-MJSQ Technical Report REV 10.0, pp. 117-132, Mar. 10, 2003.
Tariq Assaf, et al. "Automatic Generation of Diagnostic Expert Systems from Fault Trees," 2003 Proceedings Annual Reliability & Maintainability Symposium, pp. 143-147.
R. Belhassine-Cherif, et al., "Multiple Fault Diagnostics for Communicating Nondeterministic Finite State Machines," 6$^{th}$ IEEE Symposium on Computers and Communications, Jul. 3-5, 2001, pp. 661-666.
M. Ben-Bassat, et al., "A1-Test: A Real Life Expert System for Electronic Troubleshooting (A Description and a Case Study)," 4$^{th}$ Conference on Artificial Intelligence Applications, 1988, pp. 2-10.
F. Brajou, et al., "The Airbus A380—An AFDX-Based Flight Test Computer Concept," 2004 IEEE AUTOTESTCON, pp. 460-463.
Cantone, et al., "IN-ATE: Fault Diagnosis as Expert System Guided Search," Computer Expert Systems, L. Bolc & M.J. Coombs (eds.), Springer-Verlag, New York 1986, pp. 298-348.
"Computerized Diagnostic Tester at Hand," Electrical World, Aug. 1, 1975, pp. 36-38.
T.A. Cross, "A Digital Electronic System for Automobile Testing and Diagnosis," IEE Conference Jul. 6-9, 1976, London, England, pp. 152-159.
eHow Contributor, "How to Organize Computer Files," printed Mar. 31, 2011 from http://www.ehow.com/print/how_138482_organize-computer-files.html.
F. Esposito, et al., "Machine Learning Methods for Automatically Processing Historical Documents: from Paper Acquisition to XML Transformation," 1$^{st}$ Int'l Workshop on Document Image Analysis for Libraries. Jan. 23-24. 2004, pp. 328-335.
H. Garcia-Molina, et al., "dSCAM: Finding Document Copies Across Multiple Databases," 4$^{th}$ Int'l Conference on Parallel and Distributed Information Systems, Dec. 18-20, 1996, pp. 68-79.
I. Ghosh, et al., "Automatic Test Pattern Generation for Functional Register-Transfer Level Circuits Using Assignment Decision Diagrams," IEEE Transactions on Computer-Aided Design of Integrated Circuits and Systems, vol. 20. Issue 3. Mar. 2001. pp. 402-415.
B. Ives et al., "After the Sale: Leveraging Maintenance with Information Technology," MIS Quarterly, vol. 12, No. 1, Mar. 1988, pp. 7-21.
M. Koppel, et al., "Automatically Classifying Documents by Ideological and Organizational Affiliation," IEEE Int'l Conference on Intelligence and Security Informatics, Jun. 8-11, 2009, pp. 176-178.
J.C. Lin, et al., "Using Genetic Algorithms for Test Case Generation in Path Testing," 9$^{th}$ Asian Test Symposium, Dec. 4-6, 2000, pp. 241-246.
W. Linzhang, et al., "Generating Test Cases from UML Activity Diagram Based on Gray-Box Method," 11$^{th}$ Asia-Pacific Software Engineering Conference, Nov. 30-Dec. 3, 2004, pp. 1-8.
B.D. Liu, et al., "Efficient Global Strategy for Designing and Testing Scanned Sequential Circuits," IEE Proceedings on Computers and Digital Techniques, vol. 142, No. 2, Mar. 1995, pp. 170-176.
M. Mayer, "The Computerized Diagnostic Rhyme Test as a Design Tool for Armored Vehicle Intercommunications Systems," Military Communications Conference, 1985, pp. 166-170.
Microsoft at Work, "File Organization tips: 9 ideas for managing files and folders," printed Mar. 30, 2011 from http://www.microsoft.com/atwork/productivity/files.aspx.
S.M. Namburu, et al., "Systematic Data-Driven Approach to Real-Time Fault Detection and Diagnosis in Automotive Engines," 2006 IEEE AUTOTESTCON, pp. 59-65.
"Names files and folders—How to—Web Team—University of Canterbury, New Zealand," printed on Mar. 31, 2011 from http://www.canterbury.ac.nz/web/how/filename.shtml.
D. Niggemeyer, et al., "Automatic Generation of Diagnostic Mar. Tests," 19$^{th}$ IEEE Proceedings on VLSI Test Symposium, 2001, pp. 299-304.
Yiannis Papadopoulos, et al., "Automating the Failure Modes and Effects Analysis of Safety Critical Systems," Proceedings of the Eighth IEEE Int'l Symposium on High Assurance Systems Engineering (HASE '04), 2004.
F.C. Pembe, et al., "Heading-Based Sectional Hierarchy Identification for HTML Documents," 22$^{nd}$ Int'l Symposium on Computer and Information Sciences, Nov. 7-9, 2007, pp. 1-6.
F. Pipitone, "The FIS Electronics Troubleshooting System Guided Search," Computer Expert Systems, vol. 19, No. 7, 1986, pp. 68-76.
G. Qin, et al., "On-Board Fault Diagnosis of Automated Manual Transmission Control System," IEEE Transactions on Control Systems Technology, vol. 12, No. 4, Jul. 2004, pp. 564-568.

H.M.T. Saarikoski, "2T: Two-Term Indexing of Documents Using Syntactic and Semantic Constraints," 16th Int'l Workshop on Database and Expert Systems Applications, Aug. 22-26, 2005, pp. 1025-1028.

P. Samuel, et al., "UML Sequencing Diagram Based Testing Using Slicing," An Int'l Conference of IEEE India Council, Dec. 11-13, 2005, pp. 176-178.

F.Y. Shih, et al., "A Document Segmentation, Classification and Recognition System," 2nd Int'l Conference on Systems Integration, 1992, pp. 258-267.

Genichi Taguchi, et al., The Mahalanobis-Taguchi System. Published 2000, McGraw-Hill Professional. http://books.google.com/books?id=5AOuyyccV8kC&printsec=frontcover&sig=WdZNGINfzuveQpcYASuCmCvuiO (no hard copy, unable to print, must review on-line).

H. Trier, "Further Development of the Periodical Vehicle Test by Using Diagnostic Interface," IEE Colloquium on Vehicle Diagnostics in Europe, 1994, pp. 4/1-4/2.

J. van Beers, et al., "Test Features of a Core-Based Co-Processor Array for Video Applications," Int'l Test Conference, 1999, pp. 638-647.

"Volkswagon-Audi Vehicle Communication Software Manual," Snap-On, published Mar. 31, 2006, http://www.w124performance.com/docs/general/Snap-On/manuals/VCS_Manual_VW_Audi.pdf, XP007920392.

J.R. Wagner, "Failure Mode Testing Tool Set for Automotive Electronic Controllers," IEEE Transactions on Vehicular Technology, vol. 43, Issue 1, Feb. 1994, pp. 156-163.

Reuben Wright, et al., "How Can Ontologies Help Repair Your Car?" XTECH 2005: XML, the Web and beyond; May 27, 2005, Amsterdam; http://ww.idealliance.org/proceedings/xtech05/papers/02-07-02/.

* cited by examiner

Test Preparation Steps

- ✓ Disconnect TPS
- ▶ Disconnect ECM
- ✓ Connect VOM
-     Set VOM to Ohms
- ✓ Put Socket Probe on VOM Red Lead
- ✓ Put Socket Probe on VOM Black Lead

Test Steps

- ✓ Terminal A wire Shorted to Battery Volts Test
- ▶ Terminal C Wire Continuity Test
-     Terminal B wire Shorted to Volts Test
-     Throttle Position Sensor Test
-     Terminal A wire Shorted to B wire Test

DYNAMIC DECISION SEQUENCING METHOD AND APPARATUS FOR OPTIMIZING A DIAGNOSTIC TEST PLAN

CLAIM FOR PRIORITY

The present application is a continuation-in-part of, and claims priority to, U.S. patent application Ser. No. 11/452,250, filed Jun. 14, 2006, the disclosure of which is hereby incorporated by reference in its entirety.

FIELD OF THE INVENTION

The present invention relates generally to diagnostic equipment. More particularly, the present invention relates to the generation of optimized diagnostic test plans, such as vehicle diagnostic test plans, for diagnostic systems.

BACKGROUND OF THE INVENTION

Diagnostic systems are used by technicians and professionals in virtually all industries to perform basic and advanced system testing functions. For example, in the automotive, trucking, heavy equipment and aircraft industries, diagnostic test systems provide for vehicle onboard computer fault or trouble code display, interactive diagnostics, multi-scope and multimeter functions, and electronic service manuals. In the medical industry, diagnostic systems provide for monitoring body functions and diagnosis of medical conditions, as well as system diagnostics to detect anomalies in the medical equipment.

In many industries, diagnostic systems play an increasingly important role in manufacturing processes, as well as in maintenance and repair throughout the lifetime of the equipment or product. Some diagnostic systems are based on personal computer technology and feature user-friendly, menu-driven diagnostic applications. These systems assist technicians and professionals at all levels in performing system diagnostics on a real-time basis.

A typical diagnostic system includes a display on which instructions for diagnostic procedures are displayed. The system also includes a system interface that allows the operator to view real-time operational feedback and diagnostic information. Thus, the operator may view, for example, vehicle engine speed in revolutions per minute, or battery voltage during start cranking; or a patient's heartbeat rate or blood pressure. With such a system, a relatively inexperienced operator may perform advanced diagnostic procedures and diagnose complex operational or medical problems.

The diagnostic procedures for diagnostic systems of this sort are typically developed by experienced technical experts or professionals. The technical expert or professional provides the technical experience and knowledge required to develop complex diagnostic procedures. Thus, the efficacy of the diagnostic procedures, in particular the sequence in which the diagnostic procedures are performed, is highly dependent on the expertise of the technical expert or professional authoring the procedures.

Thus, existing diagnostic systems have a disadvantage in that the sequence of execution of diagnostic procedures is highly dependent upon the expertise of the technical experts and professionals who author the diagnostic procedures. The technical experts and professionals often do not have access to complete information regarding historical outcomes of diagnostic testing that has been performed, and in particular, statistical information regarding the historical outcomes of diagnostic testing. As a result, diagnostic testing can consume unnecessary time and cost, because it is based on incomplete information.

Accordingly, it is desirable to provide a method and apparatus for generating an optimized diagnostic test plan that can be executed on diagnostic systems.

SUMMARY OF THE INVENTION

The foregoing needs are met, to a great extent, by the present invention, wherein in one aspect an apparatus and method are provided that in some embodiments provide for generating an optimized diagnostic test plan that can be executed on a diagnostic system.

Embodiments of the present invention advantageously provide a method and apparatus for optimizing the simultaneous performance of multiple steps, either diagnostic steps or test preparation steps.

An embodiment of the invention includes computer-implemented method for generating testing and diagnosis procedures for vehicle diagnosis, the method including determining if a first procedure remains to be performed, if a first procedure remains to be performed, then determining whether: there is a second procedure dependent on the first procedure, or the first procedure can run in parallel to the second procedure, if there is a second procedure dependent on the first procedure, then performing the first procedure, if the first procedure can run in parallel to the second procedure, then performing the first procedure, and determining if the second procedure remains to be performed.

Another embodiment of the invention includes a diagnostic tool for generating testing and diagnosis procedures for vehicle diagnosis, the diagnostic tool including a sequencing module configured to optimize an order of a plurality of diagnostic test procedures. The sequencing module is further configured to determine if a first procedure remains to be performed, if a first procedure remains to be performed, then determine whether: there is a second procedure dependent on the first procedure, or the first procedure can run in parallel to the second procedure, if there is a second procedure dependent on the first procedure, then perform the first procedure, if the first procedure can run in parallel to the second procedure, then perform the first procedure, and determine if the second procedure remains to be performed. The diagnostic tool also includes a display module configured to format at least a step of a first diagnostic test procedure from among the plurality of diagnostic test procedures for display on a display device.

Another embodiment of the invention includes a diagnostic tool for generating testing and diagnosis procedures for vehicle diagnosis, the tool including means for determining whether there is a first procedure remaining to be performed, means for determining whether the first procedure is dependent or independent if it is determined that there is a first procedure remaining to be performed, means for performing the first procedure if it is determined that the first procedure is dependent, means for performing the first procedure if it is determined that the first procedure is independent, and means for determining whether there is a second procedure remaining to be performed if it is determined that the first procedure is independent.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 3 illustrates a representative test preparation step display image that can be prepared by the dynamic diagnostic test generator for display on a display device.

FIG. 4 illustrates a representative test step display image that can be prepared by the dynamic diagnostic test generator for display on a display device.

DETAILED DESCRIPTION

Figure 1:
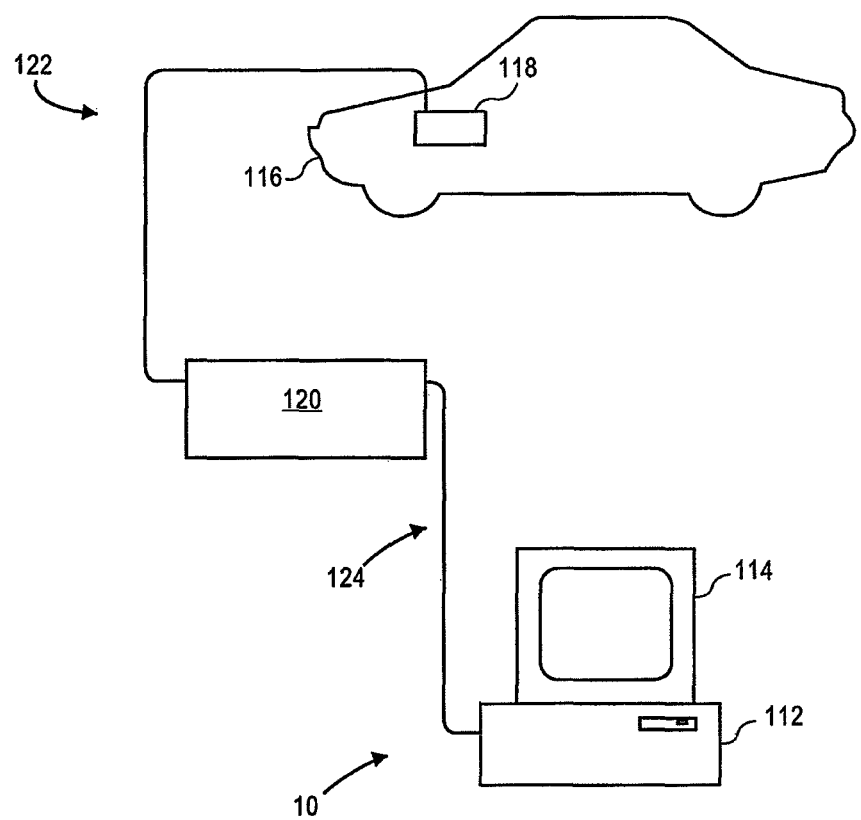
FIG. 1 illustrates an exemplary vehicle diagnostic test setup of a type suitable for carrying out the functions of an embodiment of the invention.

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized, and that structural, logical, processing, and electrical changes may be made. It should be appreciated that any list of materials or arrangements of elements is for example purposes only and is by no means intended to be exhaustive. The progression of processing steps described is an example; however, the sequence of steps is not limited to that set forth herein and may be changed as is known in the art, with the exception of steps necessarily occurring in a certain order.

A diagnostic test sequence can navigate a vehicle technician through a step-by-step test sequence based on a vehicle onboard computer trouble code or codes, or a vehicle operational symptom or symptoms. During vehicle diagnostics, for example, test step instructions and information can be displayed to the vehicle technician on a display screen panel.

A dynamic diagnostic plan generator can include a diagnostic test sequence optimizer that can arrange, or order, a sequence of diagnostic tests related to one or more symptoms to diagnose a failure mode of a vehicle based at least in part on a failure mode analysis. In addition, the sequence can be modified during test execution based on intermediate test results. The initial and iterative test sequence optimization, combined with the features below, can be referred to as "dynamic decision sequencing."

The diagnostic plan generator can also include a vehicle state tracker that can track the state of the vehicle during and between diagnostic test procedures, and a test preparation step formatter that can format a test preparation step for display on a display device based at least in part on the vehicle state. The diagnostic plan generator can further include a test procedure formatter that can format a sequence of test steps for display on a display device to provide instructions to a vehicle technician for diagnosing the failure mode. The diagnostic plan generator can also include an interactive diagnostic schematic generator that can illustrate a diagnostic test procedure, such as a wiring diagram, for display on a display device.

In addition, the dynamic diagnostic plan generator can include an information object producer that can create a data structure including information related to the diagnostic test procedures. Furthermore, the diagnostic plan generator can include a failure mode identifier sender that can send a failure mode identifier over a communication network to a central database, a historical data receiver that can receive historical data regarding the outcomes of previous diagnostic testing, and a failure mode analyzer updater that can update the failure mode analysis based on the historical data. Moreover, the diagnostic plan generator can include a failure mode test authoring system that can be used by an expert vehicle technician to create new failure mode tests.

The invention will now be described with reference to the drawing figures, in which like reference numerals refer to like parts throughout. FIG. 1 illustrates a vehicle test configuration that is compatible with the present inventive method and apparatus. A dynamic diagnostic plan generator 10 can include a personal computer 112 with a display 114. In some embodiments, the dynamic diagnostic plan generator 10 can be coupled to a vehicle 116, including, for example, a vehicle onboard computer 118. For example, the dynamic diagnostic plan generator 10 can be coupled to the vehicle onboard computer 118 by way of a vehicle interface box 120, as shown in FIG. 1. The vehicle test configuration can further include links 122, 124, such as wires, cables, data buses, a communication network, or a wireless network. The dynamic diagnostic plan generator 10 can display diagnostic test procedure instructions to a vehicle technician to aid in performing vehicle diagnostics. The dynamic diagnostic plan generator 10 can also receive feedback from the vehicle 116.

Figure 2:
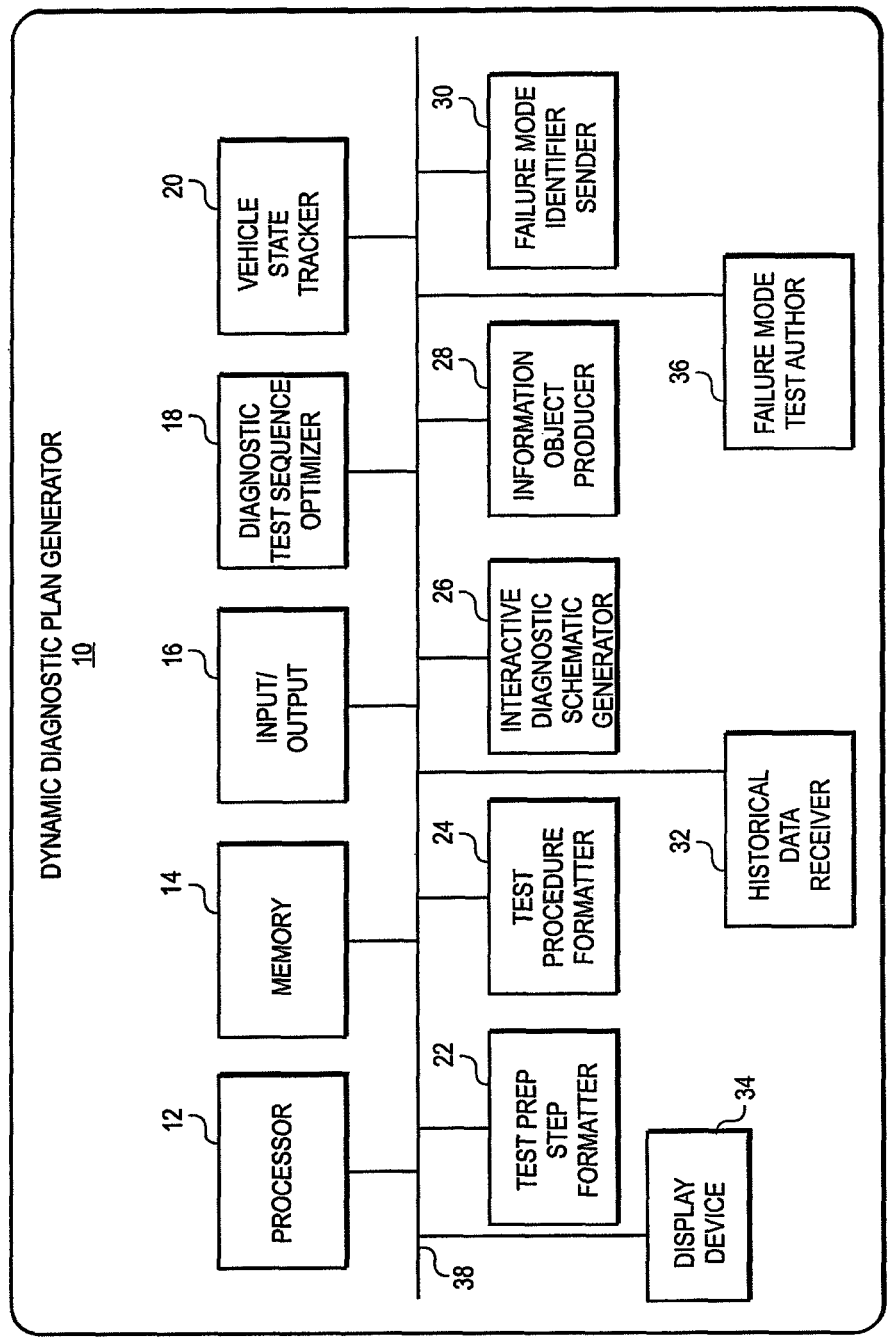
FIG. 2 is a schematic diagram illustrating a dynamic diagnostic plan generator according to a preferred embodiment of the invention.

An embodiment of the present inventive method and apparatus can generate a dynamic diagnostic plan to diagnose a failure mode of a vehicle based on one or more symptoms. FIG. 2 illustrates a dynamic diagnostic plan generator 10 for use with, for example, a PC-based vehicle diagnostic system to provide instructions for expert diagnostic procedures to allow a vehicle technician to identify the cause of a trouble code or vehicle operational problem at the component level. A related diagnostic method for use with a vehicle diagnostic system of this type is disclosed in U.S. Pat. No. 5,631,831, issued May 20, 1997, the disclosure of which is hereby incorporated by reference in its entirety.

The dynamic diagnostic plan generator 10 can include a processor 12, a memory 14, an input/output device 16, a sequencing module (e.g., a diagnostic test sequence optimizer 18), a state module (e.g., a vehicle state tracker 20), a test preparation step formatter 22, a test procedure formatter 24, a schematic module (e.g., an interactive diagnostic schematic generator 26), an object module (e.g., an information object producer 28), a failure mode identifier sender 30, a historical data receiver 32, a display module (e.g., a display device 34), and a failure mode test author 36, all of which can be interconnected by a data link 38. The processor 12, the memory 14, the input/output device 16 and the display device 34 can be part of a general computer, such as a personal computer (PC), a notebook, a UNIX workstation, a server, a mainframe computer, a personal digital assistant (PDA), or some combination of these. Alternatively, the processor 12, the memory 14 and the input/output device 16 can be part of a specialized computing device, such as a vehicle diagnostics scan tool. The remaining components can include programming code, such as source code, object code or executable code, stored on a computer-readable medium that can be loaded into the memory 14 and processed by the processor 12 in order to perform the desired functions of the dynamic diagnostic plan generator 10.

In various embodiments, the dynamic diagnostic plan generator 10 can be coupled to a communication network, which can include any viable combination of devices and systems capable of linking computer-based systems, such as the Internet; an intranet or extranet; a local area network (LAN); a wide area network (WAN); a direct cable connection; a private network; a public network; an Ethernet-based system; a token ring; a value-added network; a telephony-based system, including, for example, T1 or E1 devices; an Asynchronous Transfer Mode (ATM) network; a wired system; a wireless system; an optical system; a combination of any number of distributed processing networks or systems or the like.

An embodiment of the dynamic diagnostic plan generator 10 can be coupled to the communication network by way of the local data link, which in various embodiments can incorporate any combination of devices—as well as any associated software or firmware—configured to couple processor-based systems, such as modems, network interface cards, serial buses, parallel buses, LAN or WAN interfaces, wireless or optical interfaces and the like, along with any associated transmission protocols, as may be desired or required by the design.

Additionally, an embodiment of the dynamic diagnostic plan generator 10 can communicate information to the user and request user input by way of an interactive, menu-driven, visual display-based user interface, or graphical user interface (GUI). The user interface can be executed, for example, on a personal computer (PC) with a mouse and keyboard, with which the user may interactively input information using direct manipulation of the GUI. Direct manipulation can include the use of a pointing device, such as a mouse or a stylus, to select from a variety of selectable fields, including selectable menus, drop-down menus, tabs, buttons, bullets, checkboxes, text boxes, and the like. Nevertheless, various embodiments of the invention may incorporate any number of additional functional user interface schemes in place of this interface scheme, with or without the use of a mouse or buttons or keys, including for example, a trackball, a touch screen or a voice-activated system.

The diagnostic test sequence optimizer 18 can select and arrange in order a group of diagnostic test procedures that are related to a symptom, a vehicle operational problem or an onboard computer trouble code. An example of a diagnostic test sequence optimizer 18 that is compatible with the dynamic diagnostic plan generator 10 is disclosed in U.S. patent application Ser. No. 11/452,249, filed Jun. 14, 2006, the disclosure of which is hereby incorporated by reference in its entirety.

The diagnostic test procedure sequence can be based, for example, on a diagnostic Failure Mode and Effects Analysis (FMEA) or on an author priority setting. A FMEA, or equivalently, a Failure Mode and Effects Criticality Analysis (FMECA), is a widely used tool in manufacturing industries, for example, the aerospace industry, the automotive industry, the heavy equipment industry and the digital electronics industry.

A typical FMEA can include a list of failure modes, causes and effects associated with each of the failure modes, a severity of each failure mode, a risk or probability of the occurrence of each failure mode, and additional information that can be useful in designing and manufacturing the associated product. For example, the FMEA can include estimated probability information based on engineering analysis or statistical probability estimates based on empirical data from actual failures. Thus, each diagnostic test procedure can be an individual failure mode test based on the failure modes identified in the FMEA, and the FMEA information can be used to determine which of the diagnostic test procedures is most likely to identify the cause of the symptom.

In addition, the diagnostic test procedure sequence can be based on multiple symptoms. For example, the diagnostic test sequence optimizer 18 can evaluate two or more simultaneously occurring or intermittent symptoms in order to identify a possible common cause. Furthermore, the diagnostic test sequence optimizer 18 can dynamically reorder the test procedure sequence during test execution based on an interrelation of two or more symptoms. For example, the diagnostic test sequence optimizer 18 may identify a common voltage source for two sensors that simultaneously have symptoms, and reorder the test sequence to verify the functionality of the common voltage source before performing failure mode tests on the individual sensors. Once again, the test sequence can also be based on the comparative failure rates of the individual sensors and the common voltage source.

Moreover, in some embodiments of the dynamic diagnostic plan generator 10, the diagnostic test sequence optimizer 18 can dynamically reorder the test sequence during test execution based on intermediate results, for example, based on the results of a particular failure mode test or a combination of failure mode tests. For example, even though a particular failure mode test does not result in a final diagnosis, the failure mode test, alone or in combination with one or more other failure mode tests, can validate the correct functionality of a component. As a result, the diagnostic test sequence optimizer 18 can dynamically reorder the test sequence, for example, to omit further failure mode tests corresponding the validated component, or to move remaining failure mode tests corresponding the validated component to a later position of lesser priority in the test sequence.

Similarly, in some embodiments of the dynamic diagnostic plan generator 10, the diagnostic test sequence optimizer 18 can dynamically reorder the test sequence during diagnostic test execution based on new information derived from a particular failure mode test, although the failure mode test does not result in a final diagnosis. For example, the discovery of an additional symptom during a particular failure mode test can result in the diagnostic test sequence optimizer 18 modifying the test sequence based on the interrelation of the newly discovered symptom and the previously known symptom or symptoms. Thus, the diagnostic test sequence optimizer 18 can perform iterative, dynamic, run-time reevaluations during diagnostic test execution to continually modify or recreate the test sequence.

Some existing diagnostic test systems include sequences of diagnostic test procedures that can performed on a vehicle or other product to determine a cause of a symptom. However, in some existing systems the sequence of the diagnostic tests is determined based solely on the priority assigned by an expert diagnostic author.

An embodiment of the present invention can have the advantage that the diagnostic test procedure sequence can be optimized using statistical probability information based on historical outcomes of actual diagnostic testing in order to more accurately determine the efficacy of each of the diagnostic procedures. As a result, the diagnostic test procedure sequence can be customized to minimize or optimize the time required to resolve the problem, the cost required to resolve the problem, additional factors that can affect the problem resolution, a combination of these factors, or the like.

The diagnostic test sequence optimizer 18 can perform an analysis of the comparative utility of each of the individual diagnostic procedures based on various factors that can affect problem resolution. For example, the failure mode analysis factors can include, but are not limited to, any of the following:

an estimated time required to perform a diagnostic test;
the difficulty of performing the diagnostic test;
an estimated time required to remove and replace a component associated with the diagnostic test;
the difficulty of removing and replacing the component;
the level of expertise of a vehicle service technician performing the diagnostic procedure;
the availability of a replacement component;
the estimated cost or the actual cost of the component;
the estimated or actual cost of labor;
empirical data regarding the probability that a failure mode associated with the individual diagnostic procedure exists given the existence of a specified symptom (e.g., FMEA data);
an estimate of the probability that the failure mode exists given the existence of the symptom;
a frequency or rate of the failure mode associated with the diagnostic procedure;
the mileage of the subject vehicle;
the year of the subject vehicle;
the specific configuration of the vehicle or a modification that has been performed on the vehicle;
the vehicle maintenance record;
a service center maintenance record regarding the vehicle or associated vehicles;
a manufacturer warranty record associated with the specific vehicle or a type of vehicle;
a manufacturer warranty record associated with the specific component;
a recommended maintenance schedule, such as a manufacturer recommended maintenance schedule; or
a technical service bulletin issued by the vehicle manufacturer.

In addition, the diagnostic test sequence optimizer 18 can assign a weight, or weighting, to each of the factors used in the failure mode analysis. For example, a heavier weighting can be given to the time required to perform an individual diagnostic procedure versus the cost of performing the procedure and replacing an associated component. Conversely, the cost can be weighted heavier than the time required. Similarly, a greater weight can be assigned to the difficulty of performing the diagnostic procedure, for example, in relation to the expertise level of the vehicle technician.

In other cases, a greater weighting may be placed on the availability of a replacement component. For example, a diagnostic procedure related to a component that is not available may be given a particularly low weighting. In yet other cases, a heavier weighting can be assigned to a diagnostic procedure associated with a recommended maintenance procedure that is coming due, for example, based on the vehicle mileage, and has not been performed on the subject vehicle. Similarly, a heavy weighting can be placed on a diagnostic procedure related to a technical service bulletin, such as a recommended technical service bulletin issued by the vehicle manufacturer.

Furthermore, the weights can be partially determined based on user preferences. For example, a user preference setting can be set by a diagnostic procedure author, by a service center, by a vehicle technician, or by a combination thereof, and subsequently factored into the individual weightings of the factors. For example, a service center or a vehicle technician may prefer to minimize either time or cost, depending on the vehicle type, customer feedback or the like. Thus, a user input can be used by the diagnostic test sequence optimizer 18 in determining the weightings of certain critical factors in accordance with user preferences.

Moreover, the diagnostic test sequence optimizer 18 can receive a history of the vehicle (e.g., over the data link 38), for example, a maintenance or repair record kept with the vehicle, at a service center, or by the manufacturer. For example, the vehicle history can include information such as the mileage on the subject vehicle, the specific configuration of the vehicle, a modification such as a technical service bulletin that has been performed on the vehicle, a vehicle maintenance record, a service center maintenance record associated with the specific vehicle or type of vehicle, or a manufacturer warranty record associated with the specific vehicle or type of vehicle or component having problems.

Accordingly, the diagnostic test sequence optimizer 18 can use the results of the failure mode analysis, the vehicle history, user settings received by way of user input, a diagnostic FMEA or other input factors to order the diagnostic test procedures in a sequence. The sequence can be optimized in accordance with, for example, a priority input by a diagnostic test procedure author, a user preference input and any combination of the failure mode analysis factors. Thus, the diagnostic test sequence optimizer 18 is highly configurable to allow customization of the sequence optimization process.

In addition, the vehicle state tracker 20 can track the state of the vehicle during and between individual diagnostic test procedures. The vehicle state tracker can help to eliminate duplication of efforts during a diagnostic test sequence by keeping track of the current vehicle test configuration and providing test preparation steps to reconfigure the vehicle between individual diagnostic procedures without redundant steps. The vehicle state tracker can track the current state of the vehicle by maintaining a current list of preconditions, or vehicle test configuration information.

An example of a method for tracking the vehicle state for use with a vehicle diagnostic system is disclosed in U.S. patent application Ser. No. 11/452,243, filed Jun. 14, 2006, the disclosure of which is incorporated by reference in its entirety.

The vehicle state tracker 20 can determine a set of preconditions, or vehicle test configuration requirements, necessary for an individual diagnostic test procedure. Preconditions and corresponding test preparation steps can be created, or authored, for example, by an expert diagnostics technician. Preconditions can also be formatted to be reusable in various diagnostic test procedures, which can save time during the authoring phase of diagnostic test procedures.

In operation, the vehicle state tracker 20 typically can determine the preconditions required for a subsequent diagnostic test procedure before the completion of a current diagnostic test procedure in order to prevent or minimize redundant efforts at the completion of the current diagnostic procedure and at the initiation of the subsequent diagnostic procedure. The vehicle state tracker 20 can read the current state of the vehicle, for example, from a memory register. In some embodiments, the vehicle state can be stored in a processor register, while in other embodiments the vehicle state can be stored in a main memory register or in a memory register of a storage device associated with the dynamic diagnostic plan generator 10.

The vehicle state tracker 20 can verify a current setting of the vehicle state with regard to a specific precondition, or a group of current settings corresponding to a number of preconditions. If a precondition is required for the subsequent test procedure and the corresponding vehicle state setting is currently not valid, the test preparation step formatter 22 can format a test preparation step for display on the display device 34 to instruct the vehicle technician to set up the required precondition or vehicle test configuration. As an example, FIG. 3 illustrates a representative test preparation step display screen 40 that can be prepared by the test preparation step formatter 22. Of course, if the precondition is required for the subsequent test procedure and the corresponding vehicle state setting is currently valid, the test preparation step formatter 22 may elect not to format a test preparation step for display.

In addition, the vehicle state tracker 20 can receive feedback indicating when the precondition has been satisfied. For example, the vehicle state tracker 20 can receive a data signal from the vehicle onboard computer indicating that the precondition has been satisfied. In some embodiments, the vehicle state tracker 20 can receive a feedback signal from test equipment, such as a digital multimeter coupled to the vehicle. Similarly, the vehicle state tracker 20 can receive user input from the vehicle technician by way of the input/output device 16 indicating that the precondition has been satisfied, or that the vehicle technician has complied with the test preparation step instructions.

Once the precondition has been satisfied, the vehicle state tracker 20 can update the vehicle state, for example, in a memory register, to reflect a valid setting corresponding to the precondition. Thus, the vehicle state can be continually updated to maintain a current and accurate vehicle state that is available to the diagnostic system at any time in order to determine test preparation steps required to reconfigure the vehicle between diagnostic procedures in a diagnostic test sequence.

In the case that the vehicle condition is currently valid but is not required for a subsequent test procedure, the test preparation step formatter 22 can format a test preparation step for display instructing the vehicle technician to reverse, or undo, the vehicle condition. Correspondingly, the vehicle state tracker 20 can receive feedback as described above indicating that the condition has been reversed, and can update the vehicle state, for example, in a memory register, to reflect an invalid setting corresponding to the condition, or precondition.

The vehicle state tracker 20 can maintain vehicle state settings for any number of vehicle preconditions associated with the diagnostic test procedures which can be configured to be readily available for use, or reuse, with any existing test procedure or with a new test procedure. For example, preconditions can include, but are not limited to, any of the following:

an ignition switch position;
a light switch position;
an engine run condition;
a throttle position;
an engine speed;
a vehicle speed;
a test equipment connection;
a vehicle electrical connection condition;
an ambient air temperature;
an engine inlet temperature;
an engine lubricant pressure;
engine lubricant temperature;
an engine lubricant level;
an engine coolant temperature;
an engine coolant specific gravity;
an engine exhaust gas temperature;
an engine exhaust gas content;
a transmission setting;
a brake pedal position;
a parking brake position;
a brake fluid pressure;
a fuel level;
a fuel supply pressure;
a battery voltage;
a battery charging system voltage;
a battery charging system current;
an ignition voltage;
an ignition current;
an engine cylinder compression;
a vehicle configuration; or
a vehicle modification.

Figure 5:
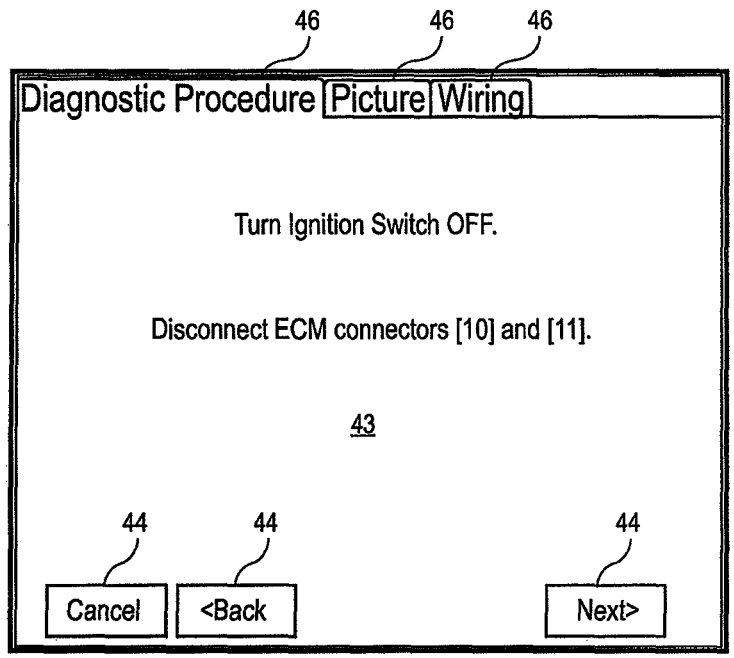
FIG. 5 illustrates a representative instruction display image that can be repaired by the dynamic diagnostic plan generator for display on a display device.

In addition, the dynamic diagnostic plan generator 10 can include a test procedure formatter 24 that can prepare the sequence of diagnostic test procedures for display on the display device. As an example, FIG. 4 illustrates a representative procedure display screen 42 that can be prepared by the test procedure formatter 24. The test procedure formatter 24 can also prepare more detailed test preparation steps for display, for example, as shown in the detailed test procedure display screen 43 illustrated in FIG. 5. The test procedure formatter 24 can further format navigational buttons 44, such as the "Cancel," "Back" and "Next" buttons shown in FIG. 5, as well as additional navigational aids, such as the tabs 46 shown in FIG. 5.

An embodiment of the present invention communicates information to the user and requests user input by way of an interactive, menu-driven, visual display-based user interface.

The dynamic diagnostic plan generator 10 can include input/output devices 16, such as a mouse and keyboard, with which the user may interactively input information using direct manipulation of a graphical user interface (GUI). Direct manipulation includes using a pointing device, such as a mouse, to select from a variety of selectable fields, including selectable menus, tabs, buttons, bullets, checkboxes, text boxes, and the like. Nevertheless, other embodiments of the invention may incorporate any number of additional functional user interface schemes in place of this interface scheme, with or without the use of a mouse or buttons or keys, including for example, a trackball, a touchscreen or a voice-activated system.

Figure 6:
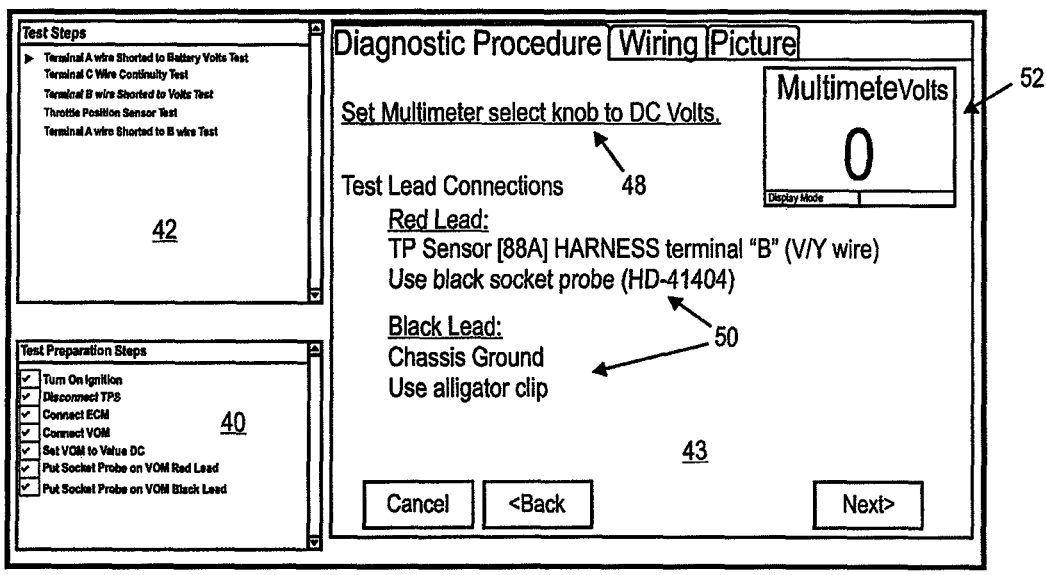
FIG. 6 illustrates a representative diagnostic procedure display image that can be prepared by the dynamic diagnostic plan generator for a display on a display device.

Similarly, the test procedure formatter 24 can prepare detailed test step instructions, as shown in display image 43, such as the representative test instruction 48, "Set Multimeter select knob to DC Volts," shown in FIG. 6. The test procedure formatter 24 can also provide detailed test setup instructions, for example, the representative test lead connections instructions 50. In addition, the test procedure formatter 24 can prepare test equipment display images, such as the multimeter display 52 shown in FIG. 6. In some embodiments, the dynamic diagnostic plan generator 10 can further receive dynamic input data, for example, a digital multimeter input for real-time display.

Furthermore, the test procedure formatter 24 and the test preparation step formatter 22 can cooperate to prepare combined display windows 50, such as the test step display image 42, the test preparation step display image 40 and the diagnostic procedure display image 43 shown in FIG. 6, which can be displayed simultaneously on the display device 34.

Figure 7:
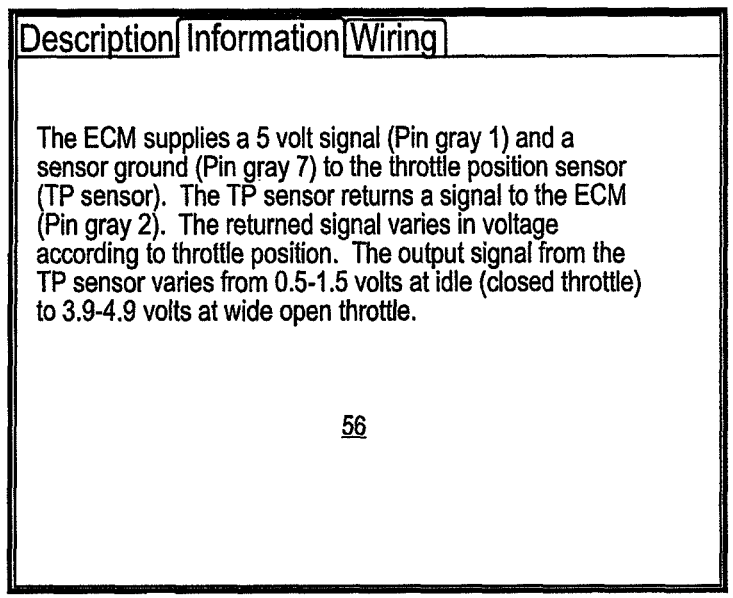
FIG. 7 illustrates an information display image that can be prepared by the dynamic diagnostic plan generator for display on a display device.
Figure 8:
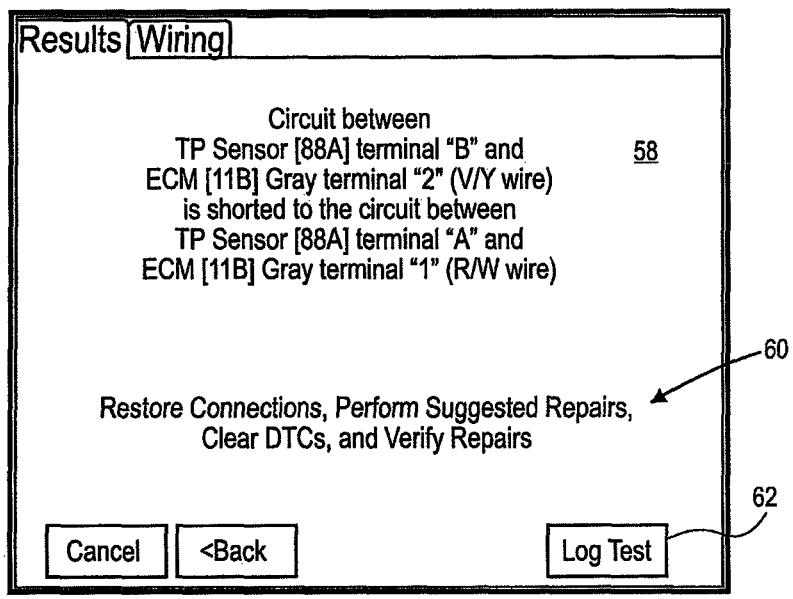
FIG. 8 illustrates a results display image that can be prepared by the dynamic diagnostic plan generator for display on a display device.

Moreover, the test procedure formatter 24 can prepare additional informational display images, such as a "description" display image (not shown) or an "information" display image 56, as shown in FIG. 7. Similarly, the test procedure formatter 24 can prepare a "results" display image 58 as shown in FIG. 8. In addition, the test procedure formatter 24 can provide specific instructions for reconfiguring the vehicle after a test procedure or a diagnostic test sequence has been completed, such as the reconfiguration instructions 60 shown in FIG. 8. Optionally, an embodiment of the diagnostic plan generator 10 can provide the vehicle technician with the option of storing the results of a diagnostic procedure in a memory 14, for example, with a "Log Test" button 62.

Figure 9:
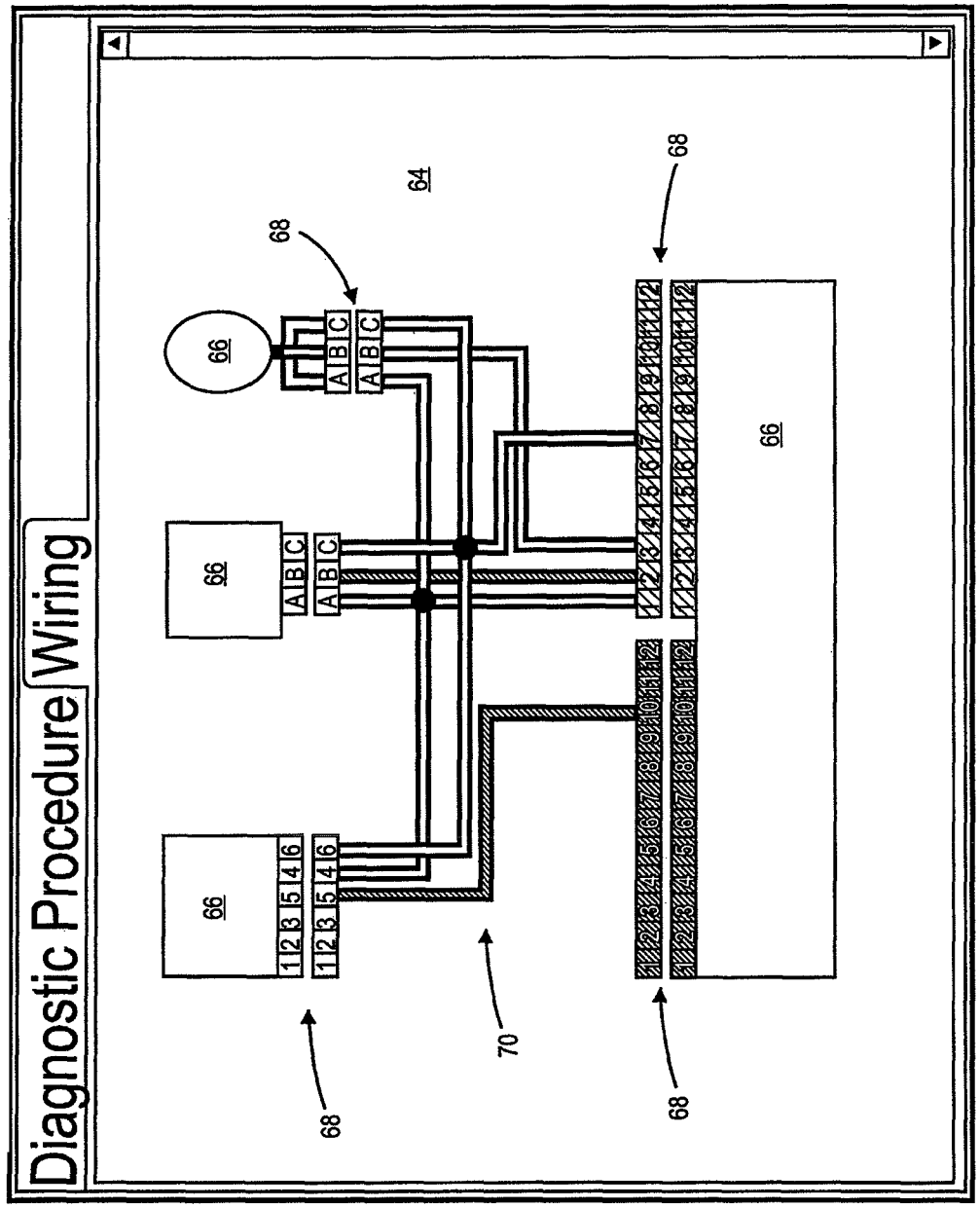
FIG. 9 illustrates a wiring schematic display image that can be prepared by the dynamic diagnostic plan generator for display on a display device.

The interactive diagnostic schematic generator 26 can generate a diagnostic schematic, such as the representative diagnostic schematic 64 illustrated in FIG. 9. An example of an interactive diagnostic schematic generator 26 that is compatible with the dynamic diagnostic plan generator 10 is disclosed in U.S. patent application Ser. No. 11/452,272, filed Jun. 14, 2006, the disclosure of which is hereby incorporated by reference in its entirety.

The interactive diagnostic schematic 64 can illustrate any number of vehicle components 66. For example, the vehicle components 66 in FIG. 9 could represent a bank angle sensor, a throttle position sensor, a cam position sensor and an electronic control module, or any additional vehicle components 66 related to a diagnostic procedure.

In order to generate the interactive diagnostic schematic 64, the interactive diagnostic schematic generator 26 can read a schematic data file associated with a diagnostic test procedure, for example, a wiring diagram data file. For example, the interactive diagnostic schematic generator 26 can read a data file from a main memory or from a peripheral memory device associated with the processor 12. In a preferred embodiment of the invention, the schematic data file can be stored in a scalable vector graphics (SVG) file format, which is an XML-based markup language for describing two-dimensional vector graphics, both static and animated (i.e., either declarative or scripted). Thus, the schematic data file can be stored as a text file.

SVG formatting can allow various types of graphic objects, for example, vector graphic shapes consisting of straight lines and curves and the areas bounded by them, raster graphics images or text. SVG formatting further can allow graphical objects to be grouped, styled, transformed and composited into previously rendered objects. SVG formatting can also permit nested transformations, clipping paths, alpha masks, filter effects, template objects and extensibility. In addition, SVG formatting can enhance searchability and accessibility of the graphics.

The interactive diagnostic schematic 64 can be dynamic and interactive. For example, a document object model (DOM) in SVG formatting can allow straightforward and efficient animation of graphics by way of script languages. The SVG graphics file format is also compatible with popular communications network standards, such as World Wide Web standards on the Internet. Additionally, SVG images can be stored using compression techniques.

SVG data files can be prepared for display on a display device 34 by any number of commercially available SVG viewers, such as the Adobe SVG Viewer, produced by Adobe Systems Incorporated of San Jose, Calif., or the Corel SVG Viewer, produced by the Corel Corporation of Ottawa, Canada.

The interactive diagnostic schematic generator 26 can modify the schematic data file to indicate a test subject in the schematic. For example, the interactive diagnostic schematic generator 26 can alter the color of the vehicle component 66, electrical connector 68, wire 70, or the like, and can highlight the test subject by surrounding the test subject with a highlighting color to make the test subject stand out from the background and the remaining items in the schematic.

Likewise, the interactive diagnostic schematic generator 26 can shade the test subject, fade the color of the test subject, gray out the test subject, or animate the test subject. For example, the interactive diagnostic schematic generator 26 can animate the test subject by making the vehicle component 66, electrical connector 68, wire 70, or the like, blink or flash in the schematic 64 when displayed on a display device 34. This can be accomplished, for example, by adding executable code in a scripting language to the schematic data file.

Similarly, the interactive diagnostic schematic generator 26 can animate the test subject by adding motion to the schematic 64, for example, demonstrating the connection or disconnection of an electrical connector 68. The interactive diagnostic schematic generator 26 can also zoom in on a specific component 66, for example, when a user clicks on the component 66 using a pointing device, such as a mouse. Furthermore, the interactive diagnostic schematic generator 26 can add properties to the component 66, for example, a part number, inventory information regarding the component, a link to a help file, or the like.

The interactive diagnostic schematic generator 26 can illustrate a location on the schematic 64 where a test equipment connection is required. For example, the interactive diagnostic schematic generator 26 can highlight or otherwise locate a location or multiple locations where electrical connectors, pins, clamps, or the like associated with test equipment are to be connected to the vehicle component 66 or electrical connector 68. The interactive diagnostic schematic generator 26 can further illustrate required test equipment, such as a digital multimeter, in the schematic 64. This can aid a vehicle technician to quickly and efficiently connect test equipment for a diagnostic test procedure.

The diagnostic schematic generator 26 can format the originally stored schematic or a modified schematic for display on the display device 34. For example, the diagnostic schematic generator 26 can include an SVG viewer or cooperate with an SVG viewer to display the diagnostic schematic generator 26.

The interactive diagnostic schematic generator 26 can receive feedback, for example, by direct manipulation such as a user selecting a portion of the schematic using a mouse or the equivalent. For example, a user can "click" on a wire, a component, or another test subject within a schematic currently displayed on the screen, and the feedback receiver 36 can uniquely identify the selected test subject.

In response to the feedback, the interactive diagnostic schematic generator 26 can, for example, remove or discontinue the indication of the test subject in the schematic. That is to say, the test subject indicator 30 can remove or discontinue the highlighting, fading, graying out or animation of the test subject in the diagnostic schematic 10. Furthermore, in some embodiments, online help can be accessed by way of direct manipulation of displayed objects in the schematic.

In addition, in response to the feedback, the interactive diagnostic schematic generator 26 can mark the test subject to indicate that a diagnostic procedure, test step or other action has been performed on the test subject. Once again, the schematic generator 26 can use highlighting, shading, fading, graying out or animation of the test subject to indicate that the action has been performed. For example, the marking style used to mark the test subject to indicate that the action has been performed can be visually distinct from the indicating style used to indicate the test subject on which an action is required.

The information object producer 28 can create a diagnostic data structure, or information object, based on information related to the diagnostic test procedures. For example, the information object can include the diagnostic test procedure instructions, a list of possible causes of the symptom, the vehicle history, the current state of the vehicle, a diagnostic schematic, a Failure Mode and Effects Analysis (FMEA) compiled by the vehicle manufacturer, or the like.

Thus, the information object can include, but is not limited to, information such as the following:

an estimated time required to perform the diagnostic test procedures;
a difficulty level of performing the diagnostic test procedures;
an estimated time required to remove and replace a component associated with the diagnostic test procedures;
a difficulty level of removing and replacing a component;
an availability of a replacement component;
an estimated cost of the component;
an actual cost of the component;
an estimated cost of performing the diagnostic test procedures;
empirical data regarding the probability that a failure mode exists given the existence of the symptom;
an estimate of the probability that a failure mode exists given the existence of the symptom;
a frequency or rate of the failure mode;
a vehicle mileage;
a vehicle configuration;
a vehicle modification;
a vehicle maintenance record;
a service center maintenance record;
a manufacturer warranty record;
the recommended maintenance schedule for the vehicle; or
a technical service bulletin.

The failure mode identifier sender 30 can send a failure mode identifier (ID) indicating the failure mode over a communication network to a central database. For example, the failure mode identifier can be sent to a service center database, a manufacturer warranty database, or the like, over the Internet, an intranet, or a wireless network. In addition, the failure mode identifier can include additional information associated with the diagnostic case, such as observed symptoms, diagnostic trouble codes (DTCs), a vehicle identification, a vehicle history, a vehicle state as measured and observed, systematic data readings, specific parameters relevant to the optimization process (for example, any of the factors enumerated above), and the final diagnostic conclusion. The final diagnostic conclusion, can include a failure-mode identifier or a no-failure-mode-identified diagnosis. In this manner, the failure mode occurrences can automatically be gathered in a central database in order to allow analysis of failure mode occurrences to continually update the statistical failure mode information.

The historical data receiver 32 can receive failure mode historical data over a communication network from a central database, for example, the results of a Failure Mode and Effects Analysis performed by the vehicle manufacturer using automatically-updated information from a region, a country, or an entire fleet of vehicles. The historical failure mode data can be used by the diagnostic test sequence optimizer 18 to order the diagnostic test procedures in an optimal sequence based on the latest updated information available. As a result, the diagnostic test sequence compiled by the dynamic diagnostic plan generator 10 can change over time in a dynamic manner, based on actual failure mode occurrences.

Furthermore, the failure mode test author 36 can provide a vehicle diagnostic system authoring capability to facilitate the creation of failure mode test procedures by an individual who is an expert in vehicle diagnostics but is not necessarily knowledgeable concerning a computer programming language. The failure mode test author 36 can accelerate development and reduce errors in diagnostic software by eliminating the need for a computer programmer to code the process as explained by an expert in vehicle diagnostics. Thus, the failure mode test author 36 can be particularly useful to an original equipment manufacturer for developing electronic diagnostic sequences.

A related method for authoring diagnostic procedures for use with a vehicle diagnostic system is disclosed in U.S. patent application Ser. No. 11/052,118, filed Feb. 8, 2005, the disclosure of which is hereby incorporated by reference in its entirety.

Figure 10:
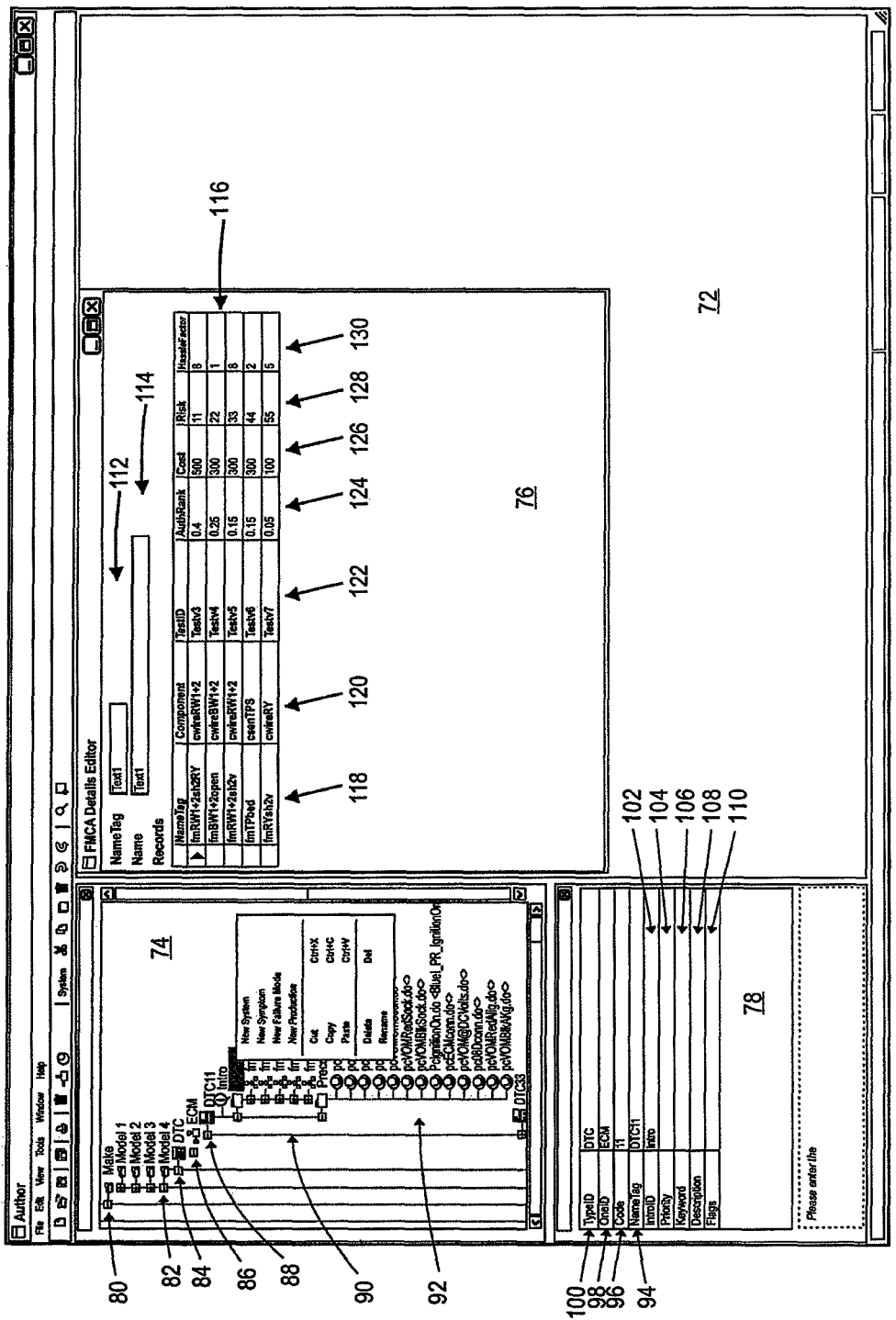
FIG. 10 illustrates an author display image that can be prepared by the dynamic diagnostic plan generator for display on a display device.

A representative failure mode authoring display image is shown in FIG. 10, comprising a graphical user interface (GUI) work environment for use by an expert author to develop a test structure for a failure mode test. The work environment can include a test structure display image 74, a FMEA details editor display image 76 and a symptom properties display image 78. The failure mode test work environment can allow a diagnostics author to interactively create a failure mode test that can be used in a diagnostic test sequence, including associated details or properties.

For example, the test structure display image 74 can include a hierarchical breakdown, for example, by vehicle make 80, vehicle model 82, symptom type 84, vehicle component 86, and symptom 88. Each symptom 88 can be associated with a group of failure mode tests 90 and preconditions 92. The symptom properties display image 78 can display properties or information stored by the dynamic diagnostic plan generator 10 regarding a specific symptom. For example, symptom properties can include a name or nametag 94 corresponding to the symptom, a code 96 corresponding to the symptom, a component identifier 98 and a symptom type identifier 100. The symptom properties can further include additional information, such as an introduction identifier 102, a priority 104, a key word 106, a description 108, and one or more flags 110 associated with the symptom.

The FMEA details editor display image 76 can display FMEA information stored by the dynamic diagnostic plan generator 10, such as statistical probability factors based on actual failure mode occurrences corresponding to the symptom. For example, the FMEA information can include a nametag field 112, a name field 114, and a listing of records 116 associated with individual failure mode tests. Each of the records can include, for example, a name tag 118, a component 120 associated with the failure mode, a test identifier 122, an author rank assigning an estimated probability to the failure mode test 124, a cost 126 associated with performing the failure mode test, a risk 128 associated with the failure mode test, a difficulty factor 130, or other information associated with the failure mode test.

In operation, an expert diagnostic author can use an authoring work environment 72 to create a new failure mode test. The author can define the system to which the failure mode corresponds, for example, by specifying the vehicle make 80 and model 82. The author can also specify the symptom type 84 or category, for example, a vehicle-defined symptom such as a diagnostic trouble code (DTC), or a user-defined symptom. The author can further define a pertinent system or unit 86 and a specific symptom 88 to be diagnosed.

The author can then define an introduction associated with the symptom to provide information about the symptom to the vehicle technician. The introduction can include, for example, a failure mode description, circuit diagrams, tips, or the like. In addition, the author can define multiple failure modes 90 associated with the symptom. The author can create a reusable failure mode test for each failure mode and associate preconditions 92 required for each failure mode test. Preconditions 92 can be procedures that must be completed prior to the performance of the failure mode test, as previously discussed. Once created, a precondition 92 can be reused for additional failure mode tests.

The author can further specify a sequence associated with the preconditions for a failure mode test, an indication as to whether the precondition must be removed or reversed after the failure mode test, and associated procedures for removing or reversing preconditions after the failure mode test.

Figure 11:
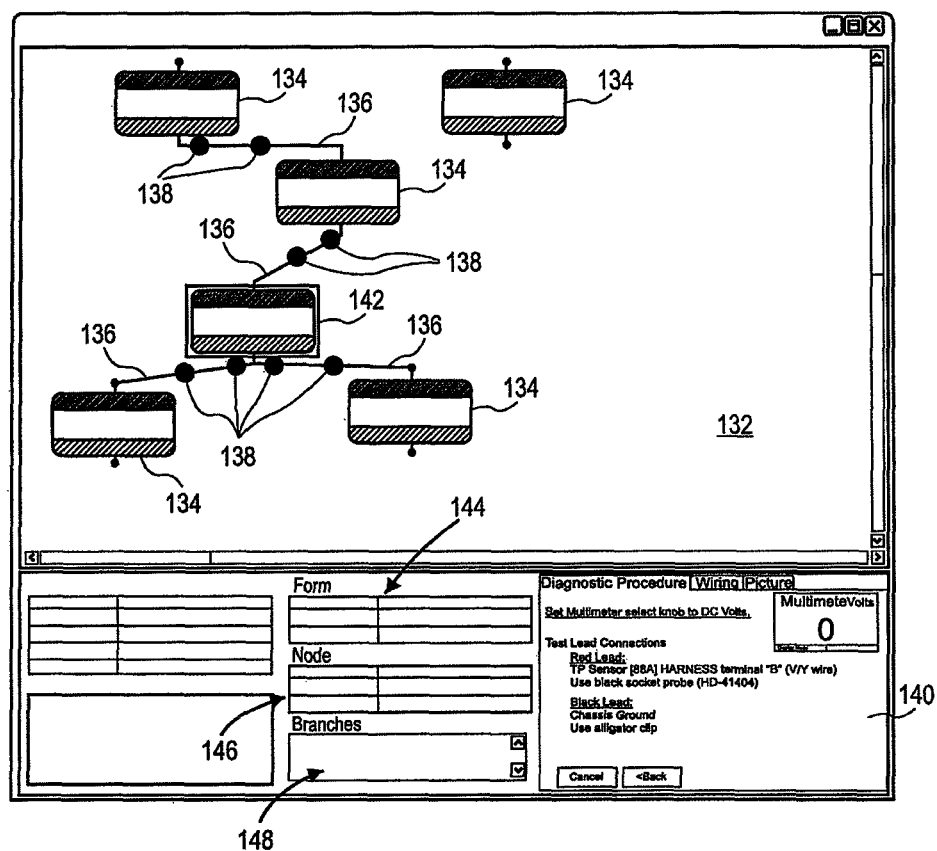
FIG. 11 illustrates a representative failure mode test creation screen that can be prepared by the dynamic diagnostic plan generator for display on a display device.

FIG. 11 illustrates a representative display image of a failure mode test creation display image 132 that an expert author can access, for example, by double-clicking on one of the failure modes 90 in the test structure display image 74 shown in FIG. 10. The failure mode test creation display image 132 can include, for example, nodes 134 corresponding to diagnostic test procedure steps. The nodes 134 can be connected by decision branches 136 having round bulbs 138, which represent logical expressions associated with the test nodes 134 or decision branches 136. The failure mode test creation display image 132 can further include a form 140 associated with a highlighted node 142. In addition, the failure mode test creation display image 132 can provide form fields 144 for entering information about the form 140, node fields 146 for entering information about the highlighted node 142, and a branches field 148 for entering information about the branches 136 and logical expression bulbs 138 associated with the highlighted node 142.

In addition, in some embodiments, the dynamic diagnostic plan generator 10 can perform a reverse failure analysis that can identify symptoms, or operational problems, of a vehicle and correlate each symptom to a specific failure mode or vehicle component that is the cause of the symptom. An example of a method for reverse failure analysis for use with a vehicle diagnostic system is disclosed in U.S. patent application Ser. No. 11/452,273, filed Jun. 14, 2006, the disclosure of which is incorporated by reference in its entirety.

Furthermore, in some embodiments, the dynamic diagnostic plan generator 10 can gather and organize information corresponding to an optimized diagnostic test plan from a diverse set of information sources and generate an information object. The information object can be organized, for example, in a sequence or data structure that corresponds to the optimized diagnostic test plan. Thus, the information object can be interpreted as a dynamically-created manual that has been customized in accordance with a specific optimized diagnostic test plan, and which a user can access during execution of the corresponding diagnostic test plan, or at any time during diagnosis and repair, or treatment. An example of a method for generating an information object for use with a vehicle diagnostic system is disclosed in a copending U.S. patent application Ser. No. 11/452,240, filed Jun. 14, 2006, the disclosure of which is incorporated by reference in its entirety.

Figure 12:
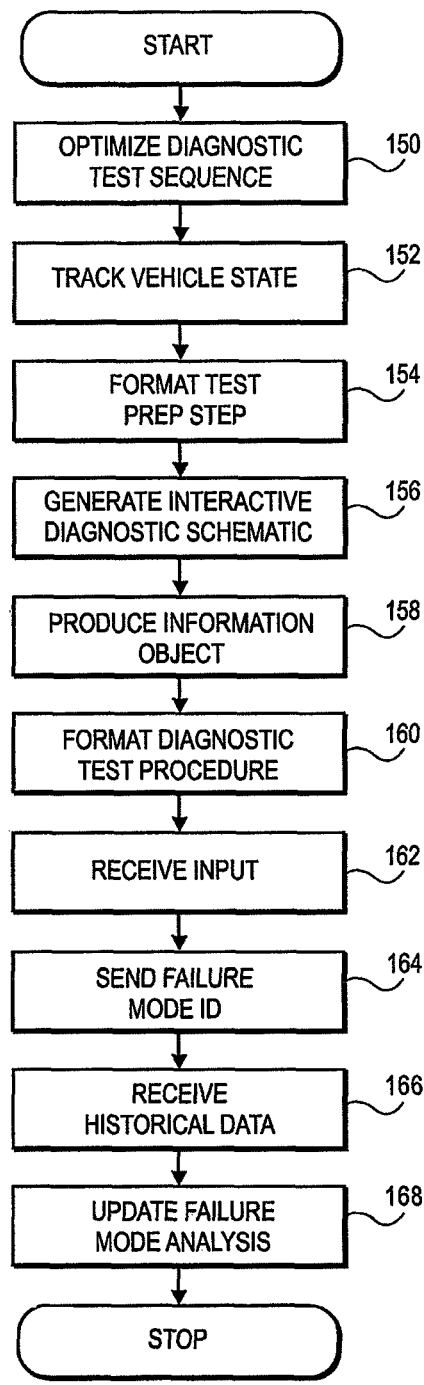
FIG. 12 is a flowchart illustrating steps that may be followed in accordance with one embodiment of the method or process of dynamically generating a diagnostic plan.

FIG. 12 illustrates a method or process for dynamically generating a diagnostic plan. The process can begin by proceeding to step 150, "Optimize Diagnostic Test Sequence," in which a sequence of diagnostic test procedures can be optimally ordered based on a failure mode analysis, a vehicle history, a current vehicle state, user preferences, or other factors that can affect the resolution of a symptom or an operational problem of a vehicle, as described above. The diagnostic test sequence optimization can take into account information from a Failure Mode Effects Analysis (FMEA), as described above.

Next, in step 152, "Track Vehicle State," a current state of the vehicle can be read from a memory and updated, as explained above. Then, based on the diagnostic test sequence and vehicle state, in step 154, "Format Test Prep Step," a test preparation step or steps can be formatted for display on a display device to provide instructions for a vehicle technician, as described above.

In turn, an interactive diagnostic schematic can be generated in step 156, "Generate Interactive Diagnostic Schematic." As explained above, the interactive diagnostic schematic can illustrate a diagnostic test procedure when displayed on a display device. Subsequently, in step 158, "Produce Information Object," an information object can be created as a data structure containing information regarding the interactive diagnostic procedures as a supplemental resource for the vehicle technician.

In step 160, "Format Diagnostic Test Procedure," a diagnostic test procedure can be formatted for display on a display device to provide instructions for the vehicle technician, as described above. In addition, in step 162, "Receive Input," input can be received indicating that the test procedures have been performed and that the associated failure mode has been verified or eliminated, as described above.

Once the failure mode has been verified, in step 164, "Send Failure Mode ID," a failure mode identifier can be sent over a communication network to a central database, for example, at a service center or a manufacturer, as described above. Correspondingly, in step 166, "Receive Historical Data," historical data regarding actual failure mode occurrences can be received, for example, from a service center, regional database, a country database, a fleet database, or the like. Consequently, in step 168, "Update Failure Mode Analysis," failure mode frequency or rate information can be updated with the historical data for use in subsequent diagnostic test sequence optimizations.

FIGS. 1 and 11 are block diagrams and flowcharts of methods, apparatuses and computer program products according to various embodiments of the present invention. It will be understood that each block or step of the block diagram, flowchart and control flow illustrations, and combinations of blocks in the block diagram, flowchart and control flow illustrations, can be implemented by computer program instructions or other means. Although computer program instructions are discussed, an apparatus according to the present invention can include other means, such as hardware or some combination of hardware and software, including one or more processors or controllers, for performing the disclosed functions.

In this regard, FIG. 2 depicts the apparatus of one embodiment including several of the key components of a general-purpose computer by which an embodiment of the present invention may be implemented. Those of ordinary skill in the art will appreciate that a computer can include many more components than those shown in FIG. 2. However, it is not necessary that all of these generally conventional components be shown in order to disclose an illustrative embodiment for practicing the invention. The general-purpose computer can include a processing unit 12 and a system memory 14, which may include random access memory (RAM) and read-only memory (ROM). The computer also may include nonvolatile storage memory, such as a hard disk drive, where additional data can be stored.

An embodiment of the present invention can also include one or more input or output devices 16, such as a mouse, keyboard, monitor, and the like. A display can be provided for viewing text and graphical data, as well as a user interface to allow a user to request specific operations. Furthermore, an embodiment of the present invention may be connected to one or more remote computers via a network interface. The connection may be over a local area network (LAN) wide area network (WAN), and can include all of the necessary circuitry for such a connection.

Typically, computer program instructions may be loaded onto the computer or other general purpose programmable machine to produce a specialized machine, such that the instructions that execute on the computer or other programmable machine create means for implementing the functions specified in the block diagrams, schematic diagrams or flowcharts. Such computer program instructions may also be stored in a computer-readable medium that when loaded into a computer or other programmable machine can direct the machine to function in a particular manner, such that the instructions stored in the computer-readable medium produce an article of manufacture including instruction means that implement the function specified in the block diagrams, schematic diagrams or flowcharts.

In addition, the computer program instructions may be loaded into a computer or other programmable machine to cause a series of operational steps to be performed by the computer or other programmable machine to produce a computer-implemented process, such that the instructions that execute on the computer or other programmable machine provide steps for implementing the functions specified in the block diagram, schematic diagram, flowchart block or step.

Accordingly, blocks or steps of the block diagram, flowchart or control flow illustrations support combinations of means for performing the specified functions, combinations of steps for performing the specified functions and program instruction means for performing the specified functions. It will also be understood that each block or step of the block diagrams, schematic diagrams or flowcharts, as well as combinations of blocks or steps, can be implemented by special purpose hardware-based computer systems, or combinations of special purpose hardware and computer instructions, that perform the specified functions or steps.

As an example, provided for purposes of illustration only, a data input software tool of a search engine application can be a representative means for receiving a query including one or more search terms. Similar software tools of applications, or implementations of embodiments of the present invention, can be means for performing the specified functions. For example, an embodiment of the present invention may include computer software for interfacing a processing element with a user-controlled input device, such as a mouse, keyboard, touchscreen display, scanner, or the like. Similarly, an output of an embodiment of the present invention may include, for example, a combination of display software, video card hardware, and display hardware. A processing element may include, for example, a controller or microprocessor, such as a central processing unit (CPU), arithmetic logic unit (ALU), or control unit.

Figure 13:
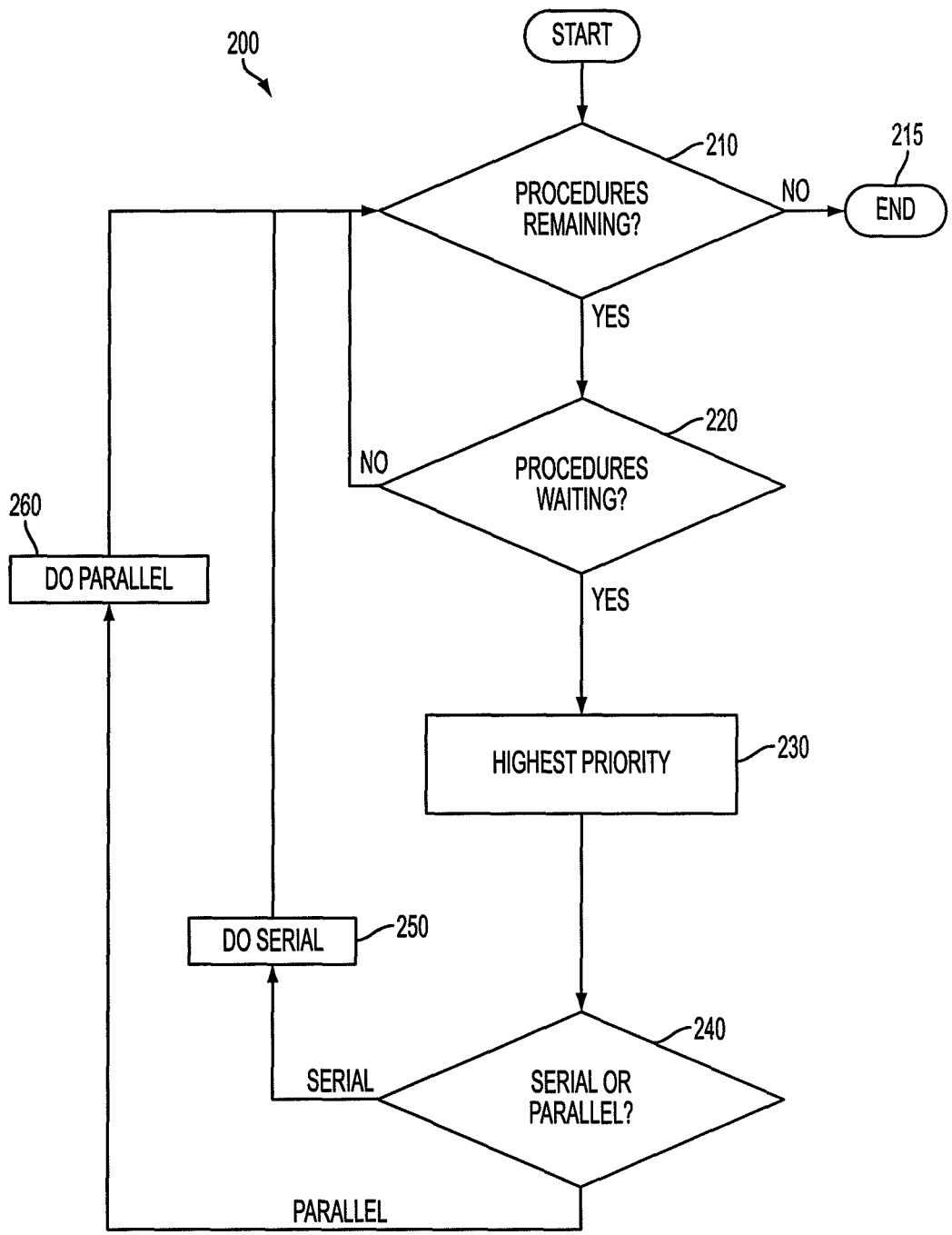
FIG. 13 is a method for generating testing and diagnosis procedures for vehicle diagnosis in accordance with an embodiment of the present invention.

FIG. 13 depicts a method for generating testing and diagnosis procedures for vehicle diagnosis in accordance with an embodiment of the present invention. The method 200 selects from a plurality of diagnostic test procedures in a memory, e.g., memory 14 (FIG. 2).

At step 210, a decision is made as to whether there are any procedures remaining to be done. If "NO," then the logic flow is complete and the process ends at step 215. If "YES," then the method proceeds to step 220. Next, at step 220, a decision is made as to whether the remaining procedures are waiting for other steps to finish, or if there are some steps waiting that can now be taken. The "NO" branch is taken back to step 210 if there are procedures that are remaining to be performed, but they cannot proceed because they are waiting for other steps to be completed. Either there may be a logical error in the step sequencing, or there may be a procedure (e.g., warming up an engine) that is running, but not yet completed. If "YES," then there is at least one procedure that can be performed at that time.

At step 230, the highest priority procedure is selected. Among the procedures that can be done, the most important (e.g., highest priority) procedure, is determined. This will be the next one to be done. The priority may be determined, for example, by the dependency among procedures, for example, a procedure to acquire a Volt-Ohm meter must be completed before a procedure to set the Volt-Ohm meter to read Ohms can be done, so the second procedure is dependent on the first. The priority may also be determined based on the received vehicle history (e.g., received over the FIG. 2 data link 38), a highest probability of identifying a cause of a symptom in a least amount of time among a group of procedures, a highest probability of identifying a cause of a symptom with a lowest cost, a decreasing probability of each procedure identifying a cause of a symptom in a least amount of time, and/or a decreasing probability of each of the additional diagnostic tests identifying a cause of the symptom with a lowest cost.

In the third decision step 240, a determination of whether the selected procedure is serial or parallel. In the terms chosen here, a serial procedure has to be completed before the next procedure can be started, e.g., the next procedure is dependent on the first being finished. A serial procedure is an atomic function, i.e., a function that, once-started, must be completed before continuing. In the terminology chosen here, a parallel procedure is chosen to mean that the procedure that can be started and can finish in parallel with other procedures being started and performed. For example, during the process of warming up the engine, which involves starting the engine and then simply waiting for the temperature to be at an appropriate level, other procedures can be performed.

If it is determined that the procedure is serial, it is completed at step 250, then the logic flows back to step 210. Again, a determination is made as to whether any procedures remain to be performed.

If the procedure is parallel, then the procedure is begun at step 260, for example, the engine of a vehicle 116 (FIG. 1) is started, and the process may lead back to step 210. While the parallel procedure is being performed, a new determination is made (step 210) as to whether any other procedures remain to be performed. Once the parallel procedure is complete, the independent procedure ends. Any remaining tasks that are dependent on the completion of this procedure can now be started. Step 220 would determine that this procedure was complete, and any step waiting for the parallel procedure to complete could proceed down the "YES" branch.

Figure 14:
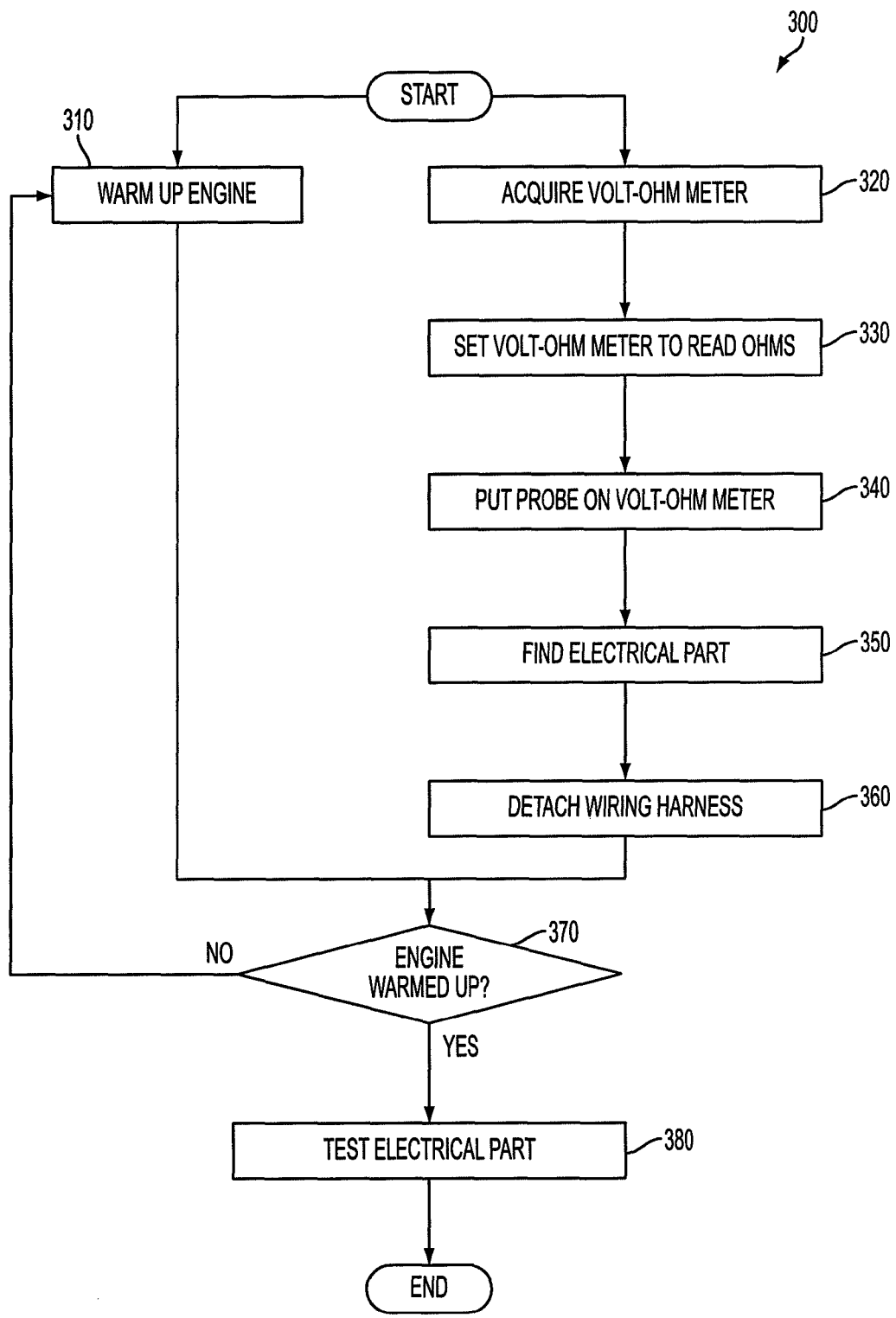
FIG. 14 is an example of a decision tree generated in accordance with an embodiment of the present invention.

FIG. 14 depicts an example of a decision tree 300 generated by an embodiment of the present invention. In order to test a particular electrical part on a vehicle, the vehicle's engine must be warmed up (step 310). This is a parallel procedure. While the engine is warming up, the operator may acquire a Volt-Ohm meter (step 320), set the Volt-Ohm meter to read Ohms (step 330), put a special probe attachment on the Volt-Ohm meter (step 340), find the electrical part in the engine compartment (step 350), and detach the wiring harness to expose the electrical part's wiring (step 360). Steps 320-360 are each serial procedures. Then, at step 370, a decision is made as to whether the warming up is completed. If "NO," then the operator must wait until it is done. If "YES," then the electrical part may finally be tested (step 390).

The processes and devices in the above description and drawings illustrate examples of only some of the methods and devices that could be used and produced to achieve the objects, features, and advantages of embodiments described herein. Thus, they are not to be seen as limited by the foregoing description of the embodiments, but only limited by the appended claims. Any claim or feature may be combined with any other claim or feature within the scope of the invention.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

What is claimed is:

1. A computer-implemented method for generating testing and diagnostic procedures for vehicle diagnosis, the method comprising:
   determining if a first testing and diagnostic procedure remains to be performed;
   if the first testing and diagnostic procedure remains to be performed, then determining whether:
      there is a second testing and diagnostic procedure dependent on the first testing and diagnostic procedure; or
      the first testing and diagnostic procedure can run in parallel to the second testing and diagnostic procedure;
   if the second testing and diagnostic procedure is dependent on the first testing and diagnostic procedure, then performing the first testing and diagnostic procedure;
   if the first testing and diagnostic procedure can run in parallel to the second testing and diagnostic procedure, then performing the first testing and diagnostic procedure; and
   determining if the second testing and diagnostic procedure remains to be performed.

2. The computer-implemented method of claim 1, further comprising:
   determining if the first testing and diagnostic procedure should wait for a priority procedure to be completed before starting; and
   if the first testing and diagnostic procedure should wait for the priority procedure to be completed, then determining if there is another procedure remaining to be performed.

3. The computer-implemented method of claim 2, further comprising:
   selecting a highest priority remaining procedure to be performed first, wherein the highest priority remaining procedure is not waiting for a priority procedure to be performed.

4. The computer-implemented method of claim 3, further comprising:
   receiving a history of the vehicle.

5. The computer-implemented method of claim 4, wherein the history comprises at least one of the following:
   a vehicle mileage, a vehicle configuration, a vehicle modification, a vehicle make, a vehicle model, a vehicle manufacturer, a vehicle maintenance record, a service center maintenance record, and a manufacturer warranty record.

6. The computer-implemented method of claim 3, wherein the highest priority procedure has a highest probability of identifying a cause of a symptom in a least amount of time among a group of procedures.

7. The computer-implemented method of claim 3, wherein the first diagnostic test has a highest probability of identifying a cause of a symptom with a lowest cost.

8. The computer-implemented method of claim 3, wherein selecting a highest priority remaining procedure is based on a decreasing probability of each procedure identifying a cause of a symptom in a least amount of time.

9. The computer-implemented method of claim 3, wherein selecting a highest priority remaining procedure is based on a decreasing probability of additional diagnostic tests identifying a cause of a symptom with a lowest cost.

10. A diagnostic tool for generating testing and diagnostic procedures for vehicle diagnosis, the diagnostic tool comprising:
   a sequencing module configured to optimize an order of a plurality of diagnostic test procedures, the sequencing module further configured to:
      determine if a first diagnostic test procedure remains to be performed;
      if the first diagnostic test procedure remains to be performed, then determine whether:
         there is a second diagnostic test procedure dependent on the first diagnostic test procedure; or
         the first diagnostic test procedure can run in parallel to the second diagnostic test procedure;
      if the second diagnostic test procedure is dependent on the first diagnostic test procedure, then perform the first diagnostic test procedure;

if the first diagnostic test procedure can run in parallel to the second diagnostic test procedure, then perform the first diagnostic test procedure; and determine if the second diagnostic test procedure remains to be performed; and a display module configured to format at least a step of the first diagnostic test procedure from among the plurality of diagnostic test procedures for display on a display device.

11. The diagnostic tool of claim 10, wherein the sequencing module is further configured to:

determine if the first diagnostic test procedure should wait for the priority procedure to be completed before starting; and if the first diagnostic test procedure should wait for a priority procedure to be completed, then the sequencing module is further configured to determine if there is another procedure remaining to be performed.

12. The diagnostic tool of claim 11, wherein the sequencing module is further configured to select a highest priority remaining procedure to be performed first if the highest priority remaining procedure is not waiting for the priority procedure to be performed.

13. The diagnostic tool of claim 12, wherein, the sequencing module is further configured to receive a history of the vehicle.

14. The diagnostic tool of claim 13, wherein the history comprises at least one of the following:

a vehicle mileage, a vehicle configuration, a vehicle modification, a vehicle make, a vehicle model, a vehicle manufacturer, a vehicle maintenance record, a service center maintenance record, and a manufacturer warranty record.

15. The diagnostic tool of claim 12, wherein the selected highest priority procedure has a highest probability of identifying a cause of a symptom in a least amount of time among the group or at a lowest cost.

16. The diagnostic tool of claim 12, further comprising:

a state module configured to track a state of the vehicle, wherein the display module further formats a test preparation step required for the first diagnostic test procedure based on the tracked vehicle state for display on the display device.

17. The diagnostic tool of claim 12, further comprising a schematic module configured to generate an interactive diagnostic schematic to illustrate the first diagnostic test procedure.

18. The diagnostic tool of claim 12, further comprising an object module configured to produce an information object based on the diagnostic test procedure.

19. A diagnostic tool for generating testing and diagnostic procedures for vehicle diagnosis, the tool comprising:

means for determining if a first testing and diagnostic procedure remains to be performed;

means for determining if a first procedure remains to be performed, and whether:

there is a second testing and diagnostic procedure dependent on the first testing and diagnostic procedure; or the first testing and diagnostic procedure can run in parallel to the second testing and diagnostic procedure;

means for determining if there is a second testing and diagnostic procedure dependent on the first procedure, if so then performing the first testing and diagnostic procedure;

means for determining if the first testing and diagnostic procedure can run in parallel to the second testing and diagnostic procedure, if so then performing the first testing and diagnostic procedure; and means for determining if the second testing and diagnostic procedure remains to be performed.

20. The diagnostic tool of claim 19, further comprising:

means for determining if the first testing and diagnostic procedure should wait for a priority procedure to be completed before starting; and means for determining if the first testing and diagnostic procedure should wait for a priority procedure to be completed, then a sequencing module is further configured to determine if there is another procedure remaining to be performed.

21. A computer-implemented method for generating testing and diagnostic procedures for vehicle diagnosis, the method comprising:

determining, via a processor of a computer, if a first testing and diagnostic procedure remains to be performed;

if the first testing and diagnostic procedure remains to be performed, then determining, via the processor, whether:

there is a second testing and diagnostic procedure dependent on the first testing and diagnostic procedure; or the first testing and diagnostic procedure can run in parallel to the second testing and diagnostic procedure;

if the second testing and diagnostic procedure is dependent on the first testing and diagnostic procedure, then performing the first testing and diagnostic procedure;

if the first testing and diagnostic procedure can run in parallel to the second testing and diagnostic procedure, then performing the first testing and diagnostic procedure; and determining if the second testing and diagnostic procedure remains to be performed.

* * * * *